United States Patent
Gomes et al.

(10) Patent No.: US 12,271,306 B2
(45) Date of Patent: Apr. 8, 2025

(54) INTEGRATED THREE-DIMENSIONAL (3D) DRAM CACHE

(71) Applicant: Intel Corporation, Santa Clara, CA (US)

(72) Inventors: Wilfred Gomes, Portland, OR (US); Adrian C. Moga, Portland, OR (US); Abhishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 17/214,835

(22) Filed: Mar. 27, 2021

(65) Prior Publication Data

US 2022/0308995 A1    Sep. 29, 2022

(51) Int. Cl.
*G06F 12/00*    (2006.01)
*G06F 12/0802*    (2016.01)

(52) U.S. Cl.
CPC ...... *G06F 12/0802* (2013.01); *G06F 2212/60* (2013.01)

(58) Field of Classification Search
CPC ....... G06F 12/00; G06F 12/0802; G06F 13/00
See application file for complete search history.

(56) References Cited

U.S. PATENT DOCUMENTS

| | | | | |
|---|---|---|---|---|
| 5,249,282 A * | 9/1993 | Segers | ............... | G06F 12/0897 |
| | | | | 711/E12.043 |
| 6,483,171 B1 * | 11/2002 | Forbes | ............. | H01L 29/78639 |
| | | | | 257/365 |
| 10,176,099 B2 * | 1/2019 | Gaur | ............. | G06F 15/781 |
| 2013/0138892 A1 | 5/2013 | Loh et al. | | |
| 2015/0016172 A1 | 1/2015 | Loh et al. | | |
| 2015/0032962 A1 * | 1/2015 | Buyuktosunoglu | ............. | |
| | | | | G06F 12/0811 |
| | | | | 711/122 |

OTHER PUBLICATIONS

Chen, Ke, et. al., "History-Assisted Adaptive-Granularity Caches (HAAG$) for High Performance 3D DRAM Architectures", Proceedings of the 2015 ACM International Joint Conference on Pervasive and Ubiquitous Computing, ACMPUB27, New York, NY, USA, Jun. 8, 2015, 11 pages.
Extended European Search Report for Patent Application No. 22158051.7, Mailed Jul. 18, 2022, 11 pages.

* cited by examiner

*Primary Examiner* — Tuan V Thai
(74) *Attorney, Agent, or Firm* — Akona IP PC

(57) ABSTRACT

Three-dimensional (3D) DRAM integrated in the same package as compute logic enable forming high-density caches. In one example, an integrated 3D DRAM includes a large on-de cache (such as a level 4 (L4) cache), a large on-die memory-side cache, or both an L4 cache and a memory-side cache. One or more tag caches cache recently accessed tags from the L4 cache, the memory-side cache, or both. A cache controller in the compute logic is to receive a request from one of the processor cores to access an address and compare tags in the tag cache with the address. In response to a hit in the tag cache, the cache controller accesses data from the cache at a location indicated by an entry in the tag cache, without performing a tag lookup in the cache.

20 Claims, 26 Drawing Sheets

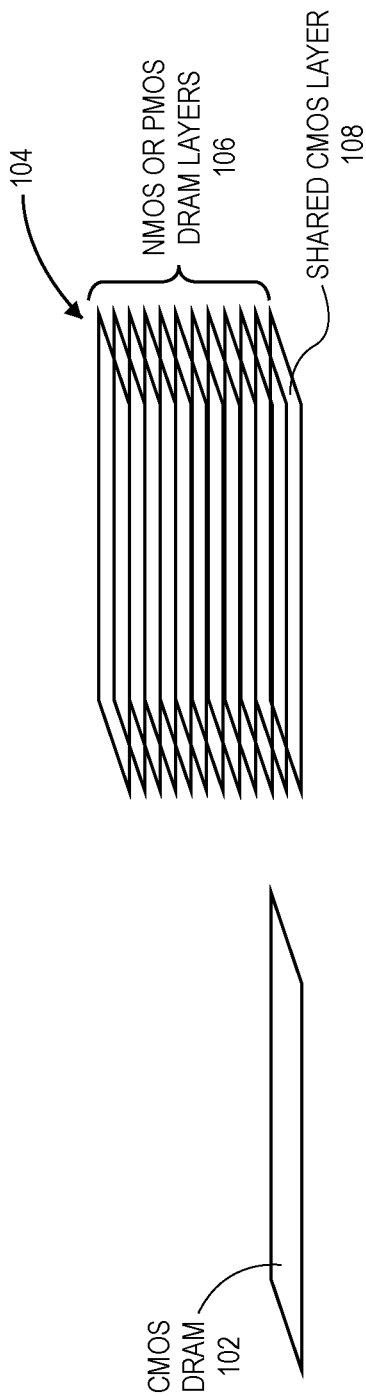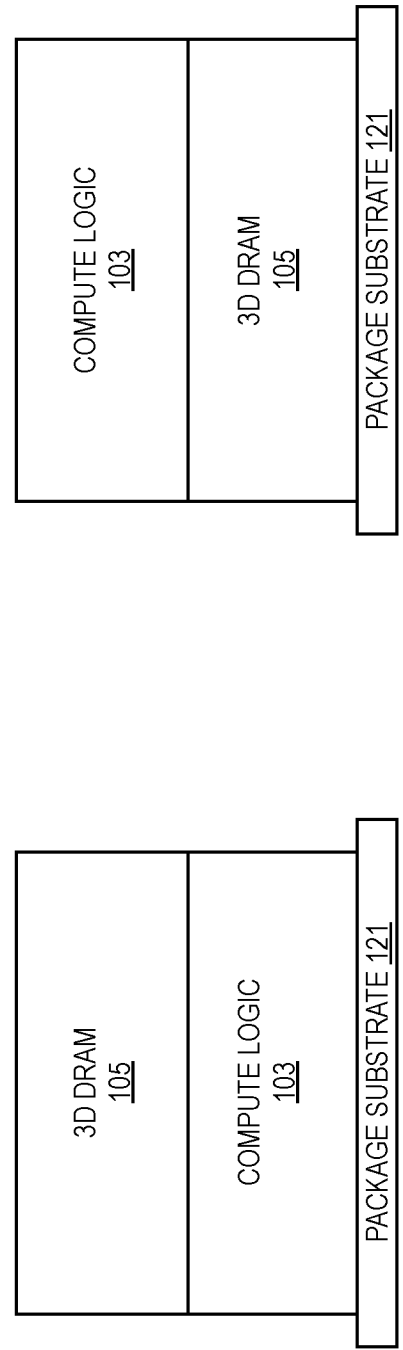

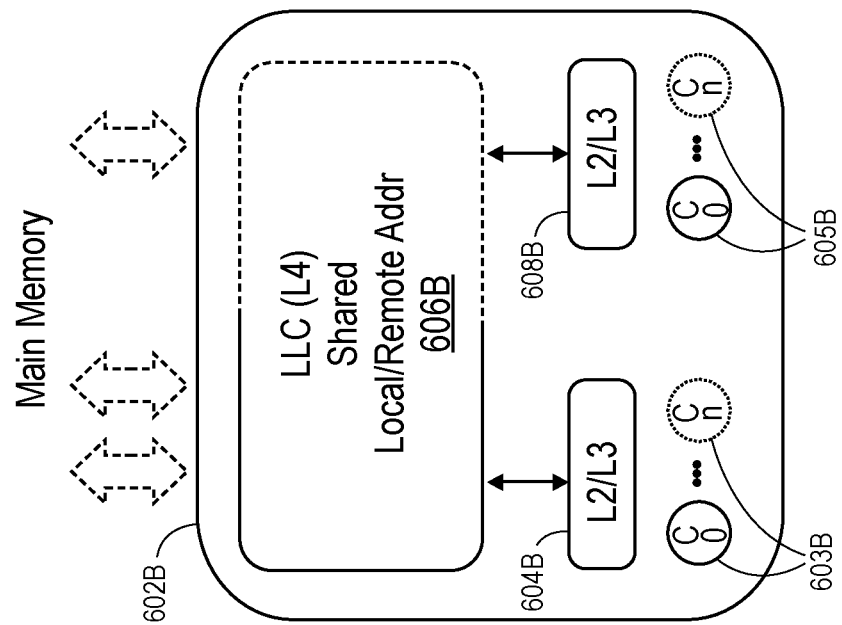
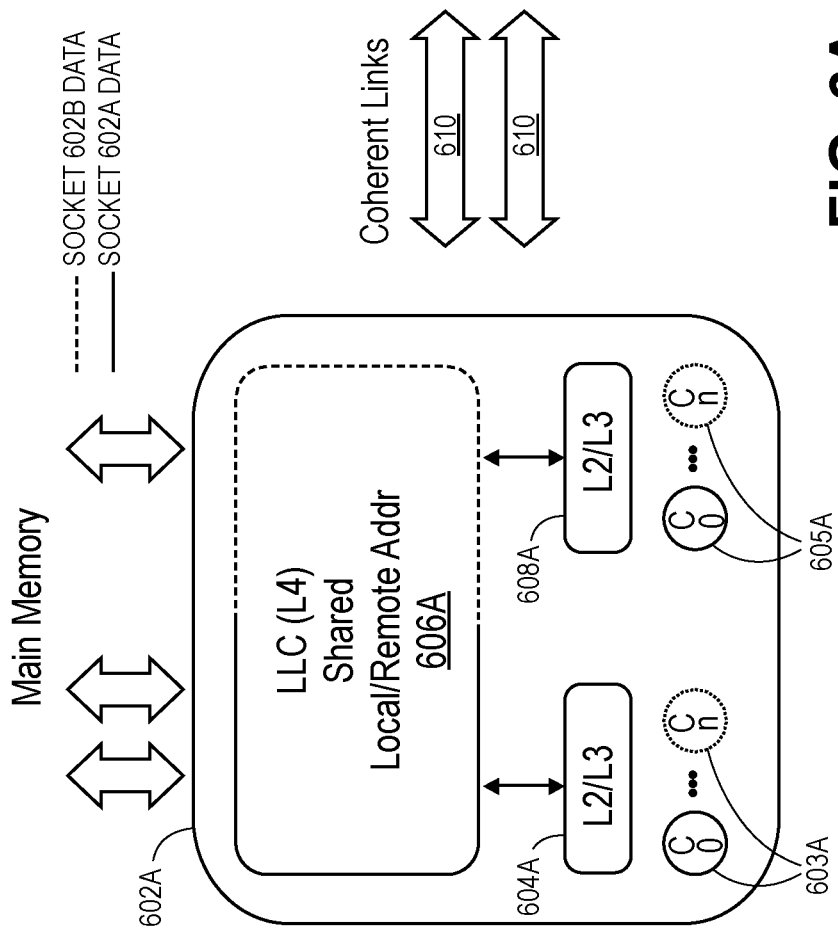
FIG. 6A

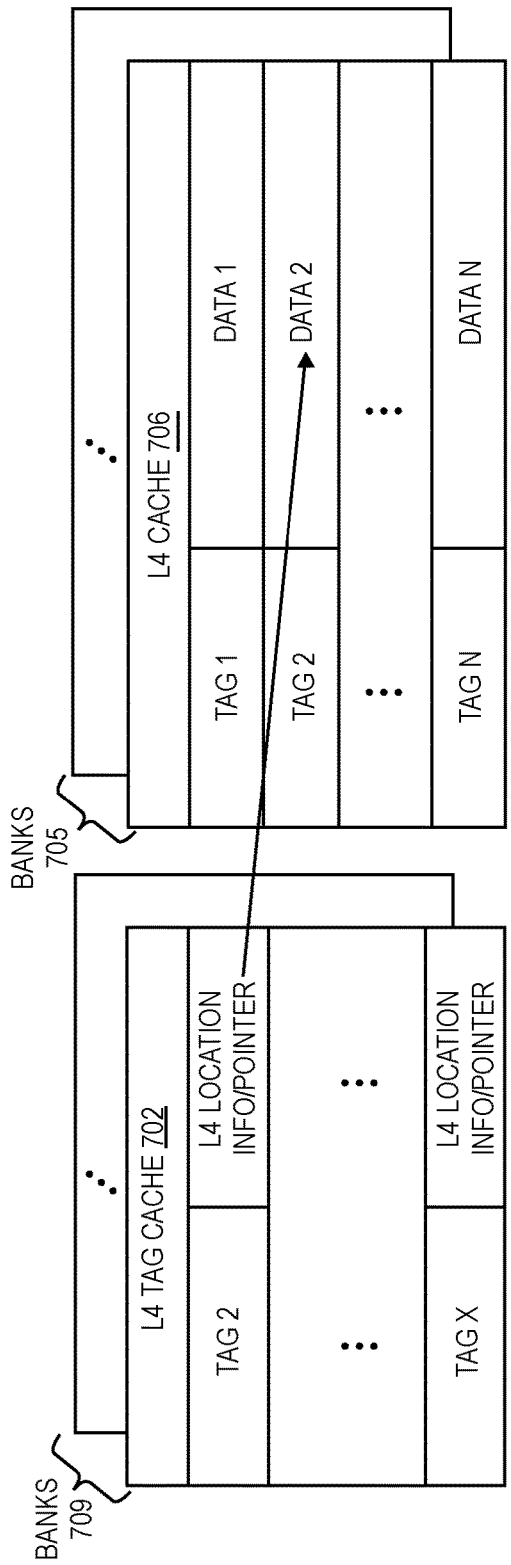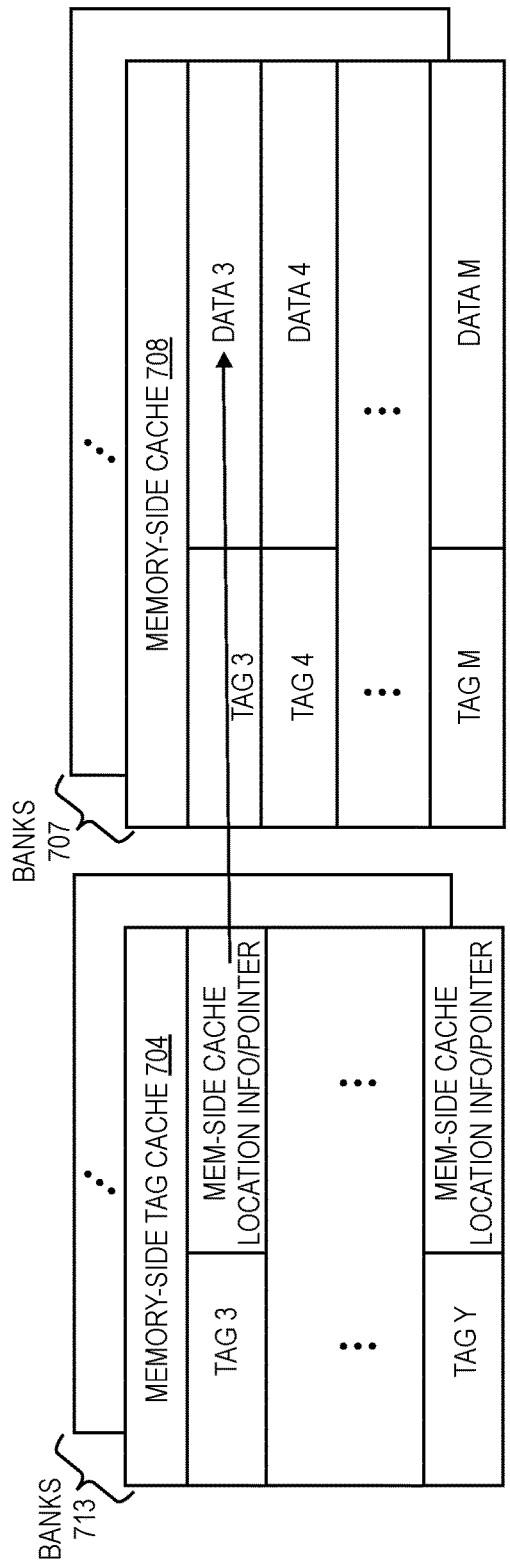
FIG. 7A
FIG. 7B

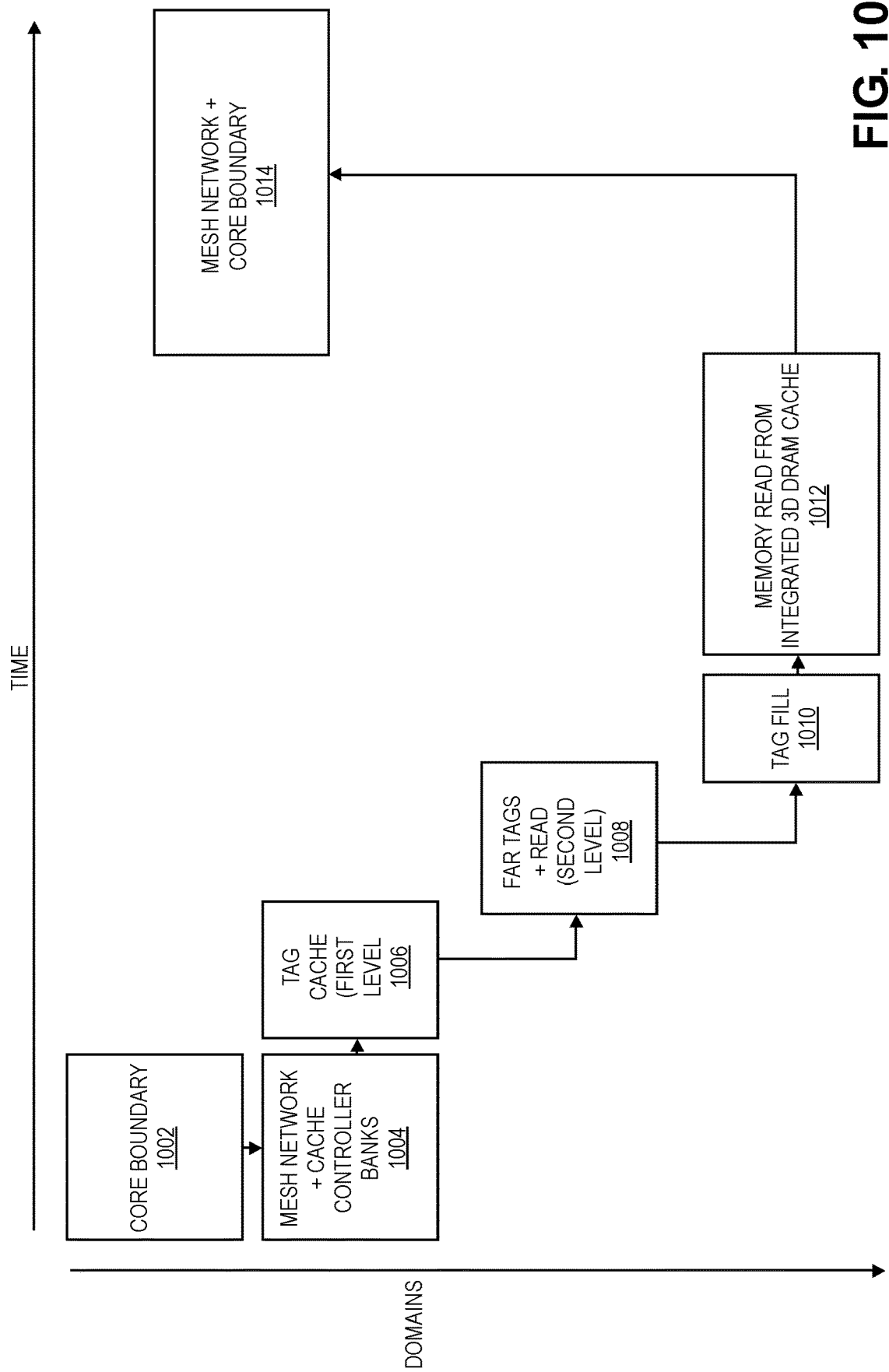

INTEGRATED THREE-DIMENSIONAL (3D) DRAM CACHE

FIELD

The descriptions are generally related to processor and memory technology.

BACKGROUND

Dynamic random-access memory (DRAM) generally includes an array of bit cells, each cell capable of storing a bit of information. A typical cell configuration consists of a capacitor for storing a charge that represents the bit being stored and an access transistor that provides access to the capacitor during read and write operations. The access transistor is connected between a bitline and the capacitor and is gated (turned on or off) by a wordline signal. During a read operation, the stored bit of information is read from the cell via the associated bitline. During a write operation, a bit of information is stored into the cell from the bitline via the transistor. The cells are dynamic in nature, and therefore must be periodically refreshed.

DRAM that is integrated on the same die or multi-chip module (MCM) as a processor or other compute logic is referred to as embedded DRAM (eDRAM). Embedded DRAM may have some performance advantages compared to external DRAM in a different package than the processor; however, existing eDRAM technology has a higher cost-per-bit compared to external DRAM and is also limited in its ability to scale.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 1A illustrates an example of a single-layer DRAM and a three dimensional (3D) DRAM.

FIGS. 1B and 1C illustrate 3D DRAM integrated with compute logic.

FIGS. 6A-6B illustrate examples of cache hierarchies with integrated 3D DRAM caches.

FIGS. 7A and 7B illustrate examples of tag caches.

FIG. 10 is a block diagram illustrating an example of a cache access flow.

Figure 1D:
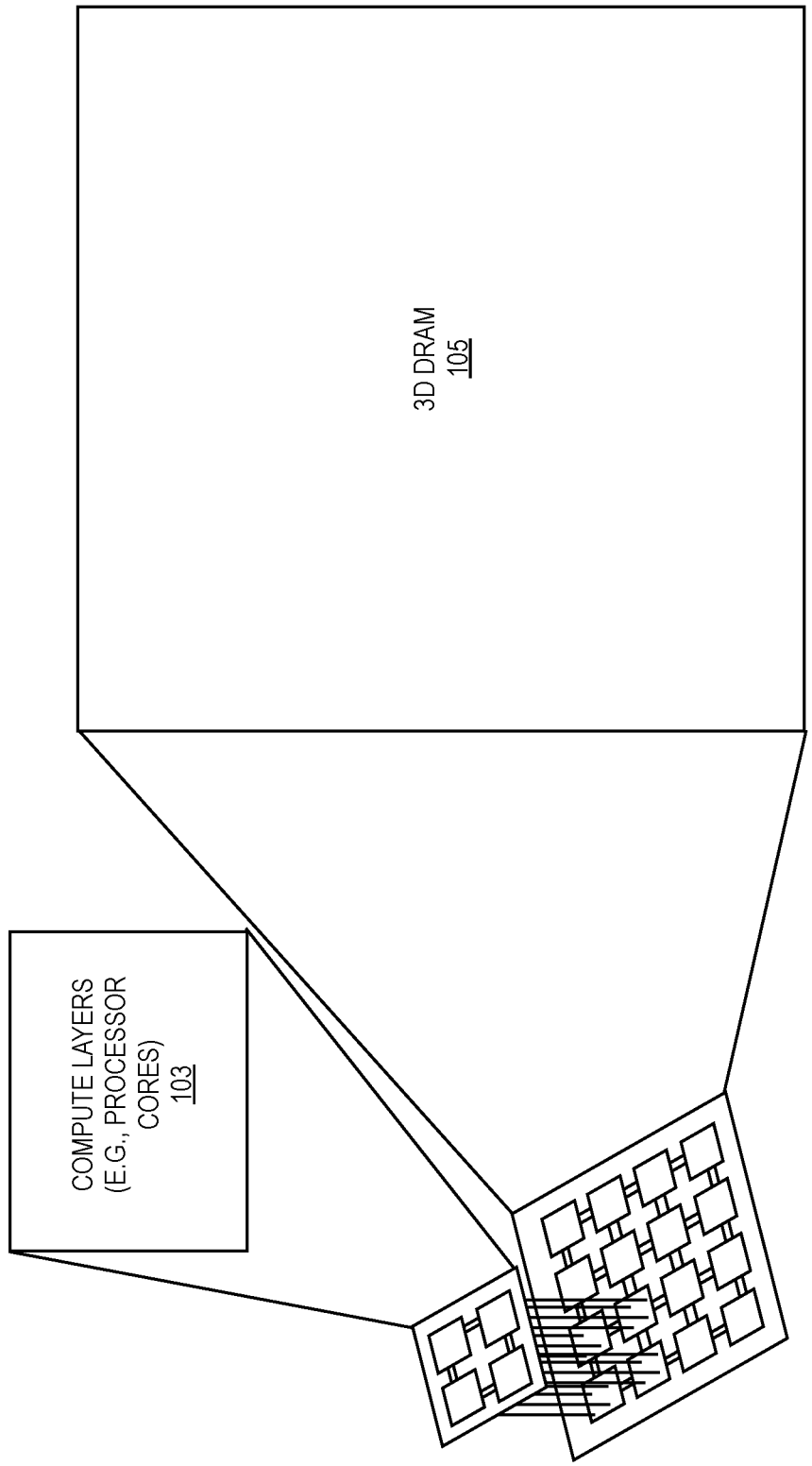
FIG. 1D illustrate 3D DRAM integrated with compute logic.

Descriptions of certain details and implementations follow, including a description of the figures, which may depict some or all of the embodiments described below, as well as discussing other potential embodiments or implementations of the inventive concepts presented herein.

DETAILED DESCRIPTION

Tightly integrated compute logic and three-dimensional (3D) memory can enable large on-package caches.

In one example, a 3D DRAM is stacked with and integrated with compute logic in the same package. The compute logic may include, for example, one or more processor cores, SRAM cache(s), and cache control circuitry. The 3D DRAM includes multiple layers of DRAM cells on a die. The multiple layers of DRAM cells and the compute logic are connected with one another with vias through the multiple layers, without the need to route signals through an underlying PCB.

The integrated 3D DRAM enables forming fast caches that are significantly larger than conventional caches. In one example, the integrated 3D DRAM includes a large level 4 (L4) cache, a large memory-side cache, or both an L4 cache and a memory-side cache. However, the large capacity of the integrated L4 and/or memory-side caches leads to significant tag overhead both in terms of space and tag access time.

In one example, the compute logic includes one or more tag caches to cache recently accessed tags from the L4 cache, the memory-side cache, or both. A cache controller in the compute logic is to receive a request from one of the processor cores to access an address and compare tags in the tag cache with the address. In response to a hit in the tag cache, the cache controller accesses data from the L4 cache at a location indicated by an entry in the tag cache, without performing a tag lookup in the L4 cache. Similarly, in a system with a memory-side cache on the integrated 3D DRAM instead of an L4 cache, a tag cache in the compute logic can store tags from the memory-side cache. In a system with both a memory-side cache and an L4 cache on the integrated 3D DRAM, the compute logic can include two tag caches (or a partitioned tag cache) to store tags for the memory-side cache and the L4 cache. The tag caches reduce the instances in which the L4 cache tags and memory-side cache tags are accessed, which can enable lower latency cache accesses.

The large integrated DRAM caches may be formed from multiple interconnected DRAM layers on a die. Conventionally, memory and processing logic are fabricated on different dies. DRAM dies conventionally include a single DRAM layer. For example, FIG. 1A illustrates an example of a single-layer DRAM 102. A conventional DRAM 102 includes a single memory layer. Existing solutions to stack DRAM involve stacking separate dies and are limited to 10-100 μm pitch connections between dies, which limits cost and performance. In contrast, 3D monolithic DRAM 104 includes multiple DRAM layers on a die. In the example illustrated in FIG. 1A, the 3D DRAM 104 includes multiple NMOS or PMOS DRAM layers 106 and a shared CMOS layer 108. In one example, each of the DRAM layers includes an NMOS or PMOS access transistor and a storage or memory element, such as a capacitor or other storage element. In one example, shared CMOS is formed from PMOS transistors from a PMOS layer and NMOS transistors from an NMOS layer. The shared CMOS includes circuitry such as a sense amplifier, control logic, and input/output circuitry. In one such example, the CMOS layer 108 may be common for the memory layers 106 and the compute layers. The 3D DRAM may be tightly integrated with one or more compute layers (e.g., by using layer transfer or by forming the DRAM in the metal stack).

For example, FIGS. 1B and 1C illustrate 3D DRAM integrated with compute logic. FIG. 1B illustrates an example in which the 3D DRAM 105 is stacked over or on top of the compute logic 103. The compute logic is then over or on top of a package substrate 121. FIG. 1C illustrates an example in which the compute logic 103 is stacked over or on top of the 3D DRAM 105, which is over or on top of the package substrate 121. Both the compute logic 103 and the 3D DRAM 105 may include multiple layers. In both systems, each layer has a vertical channel that connects to the layer above and below it, enabling power and signals to go through the layers of the compute logic 103 and the 3D DRAM 105. Thus, the 3D DRAM can be integrated on top of or under the processor cores.

In addition to varying orientation (e.g., 3D DRAM over or under the compute logic), the compute logic 103 and 3D DRAM 105 may occupy the same or similar area (footprint) or may have different sizes and occupy different areas. FIG. 1D illustrates an example in which the compute layers 103 including processor cores are over the 3D DRAM 105. In the illustrated example, the compute logic 103 have a smaller area than the 3D DRAM 105. In other examples, the 3D DRAM may have a smaller area than the compute logic and/or are located over the compute logic. FIG. 1D shows one example in which four compute dies are integrated over one 3D DRAM die, however, any number compute dies can be integrated with a number of 3D DRAM dies.

Figure 1E:
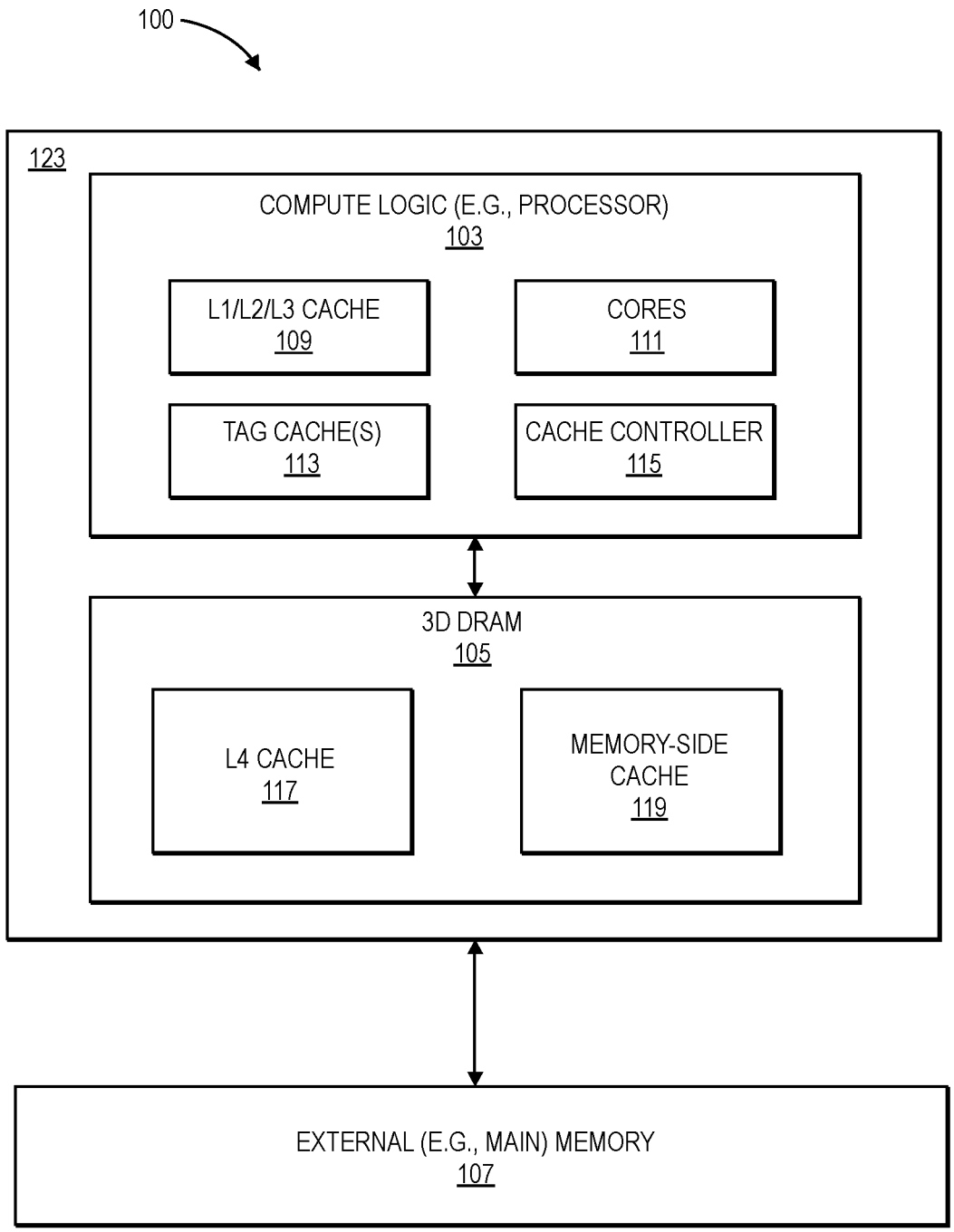
FIG. 1E illustrates a block diagram of a system with 3D DRAM integrated with compute logic.

FIG. 1E illustrates a block diagram of a system with 3D DRAM integrated with compute logic. The system 100 includes compute logic 103 with integrated 3D DRAM 105 stacked over or under the compute logic 103. The 3D DRAM 105 and the compute logic 103 are in the same package 123. The compute logic is also coupled with one or more external memory devices 107 that are external to the compute logic package (e.g., main memory).

In the illustrated example, the 3D DRAM 105 includes an L4 cache 117 and a memory-side cache 119. In other examples, the 3D DRAM may include only an L4 cache or only a memory-side cache. The L4 cache is one level of cache in a cache hierarchy, and in one example, may be considered the last level cache (LLC). In one example, the L4 cache 117 is shared by more than one processor core. In one example, the memory-side cache 119 only caches addresses and data from a local attached memory (e.g., from the local external memory device 107, but not from a remote external memory attached to another socket and/or in a different domain). In contrast, in one example, the L4 cache 117 may cache data and addresses from both a local and remote memory. In one example, one or both of the L4 cache 117 and the memory-side cache 119 are set-associative caches. However, other cache placement policies may be implemented (e.g., fully associative, or other cache placement policies). One or both of the L4 cache 117 and the memory-side cache 119 may be "banked" into multiple banks or partitions.

The compute logic includes one or more processor cores 111 and one or more levels of cache 109 (e.g., level 1 (L1), level 2 (L2), level 3 (L3), etc.). The one or more levels of cache 109 may be implemented in SRAM on the same die as the processor cores. One or more levels of cache may be private to a processor core, while other levels of cache may be shared by multiple processor cores. A cache controller 115 includes circuitry to control the access to the caches 109, 117, and 119. For example, the cache controller 115 may include circuitry for implementing cache placement and cache replacement/eviction policies. In one example, the cache controller 115 is "banked" to include separate cache control logic (cache controller banks) for different banks and/or levels of cache. The compute logic 103 also includes one or more tag caches 113 to store recently accessed tags from the L4 cache 117 and/or memory-side cache 119.

FIGS. 2, 3B, 4A, 5A, 5B, and 5C illustrate examples of 3D DRAM with multiple DRAM layers.

Figure 2:
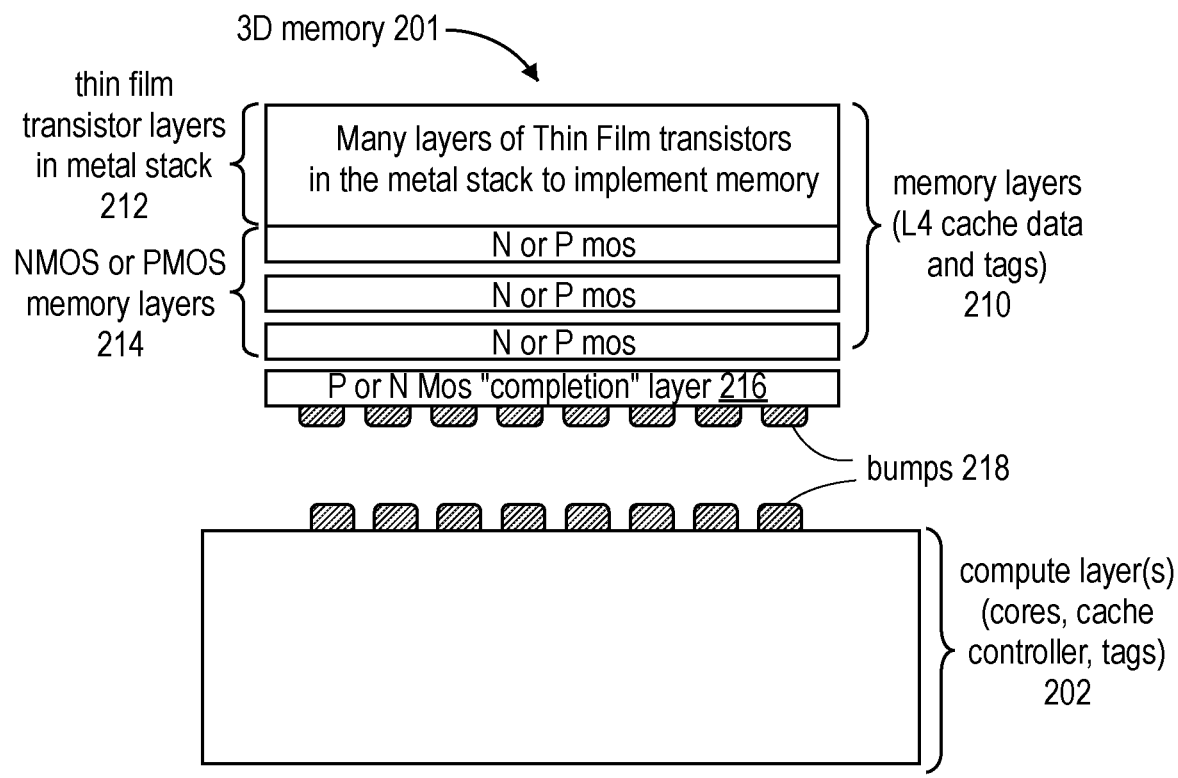
FIG. 2 illustrates an example of monolithic computes and 3D monolithic memory.

FIG. 2 illustrates an example of monolithic computes and 3D monolithic memory. The monolithic 3D memory 201 includes multiple memory layers 210 and an NMOS or PMOS "completion layer" 216. In the example in FIG. 2, the multiple memory layers 210 include two types of memory: memory 212 implemented with many layers of thin film transistors in the metal stack, and silicon-based NMOS or PMOS memory layers 214. The example in FIG. 2 illustrates both types of 3D DRAM, however, other examples may include only thin film transistor-based memory layers, silicon-based NMOS or PMOS memory layers, or another 3D memory with multiple memory layers.

In the illustrated example, memory formed with the NMOS or PMOS memory layers includes a completion layer 216. The completion layer 216 includes a layer of PMOS transistors or a layer of NMOS transistors, which, when combined with some transistors from the memory layers 214, forms the control logic and access circuitry (CMOS circuitry) for the memory layers 214. The CMOS circuitry for control and access of the memory layers may include, for example, sense amplifiers, drivers, test logic, sequencing logic, and other control or access circuitry. In one example, if the memory layers 214 are NMOS memory layers, the completion layer is a PMOS layer to form the CMOS control circuitry from the PMOS layer and some NMOS transistors from the NMOS memory layers. Thus, in one such example with multiple NMOS DRAM layers, each of the multiple NMOS DRAM layers including NMOS select transistors and storage elements, and a PMOS layer includes PMOS transistors to form CMOS circuitry in combination with NMOS transistors from one or more of the multiple NMOS DRAM layers. Similarly, if the memory layers 214 are PMOS memory layers, the completion layer is an NMOS layer to form the CMOS control circuitry from the NMOS layer and some PMOS transistors from the PMOS memory layers. Thus, in one example, the PMOS or NMOS layer 216 includes transistors for control logic, but does not include memory elements, and therefore is not a memory layer, like the layers 214. In one example, some or all of the memory layers 214 include memory (select transistors and memory elements) and not control logic. In one example, each of the layers 214 and 216 include only one transistor type (e.g., only PMOS or only NMOS), which reduces cost.

The monolithic 3D memory technologies enable scaling with many memory layers to form a very large memory integrated with a processor. The large integrated memory can operate as one or more caches (or levels of cache) of on-package cache that is significantly larger than conventional caches. Thus, the monolithic 3D memory 201 can store data (e.g., data cachelines) and tags for operation as a cache.

The compute layer(s) 202 are bonded with the 3D memory 201 via a bonding technique (e.g., bonding solder bumps, balls, exposed contacts, pads, etc.). The compute layer(s) 202 includes processor cores, a cache controller, and other compute logic. The compute layers 202 may also include one or more SRAMs to operate as caches. In one example, at least some tags are stored in an SRAM in the compute layers 202. For example, one or more tag caches may be implemented in SRAM in the compute layers 202.

Figure 3A:
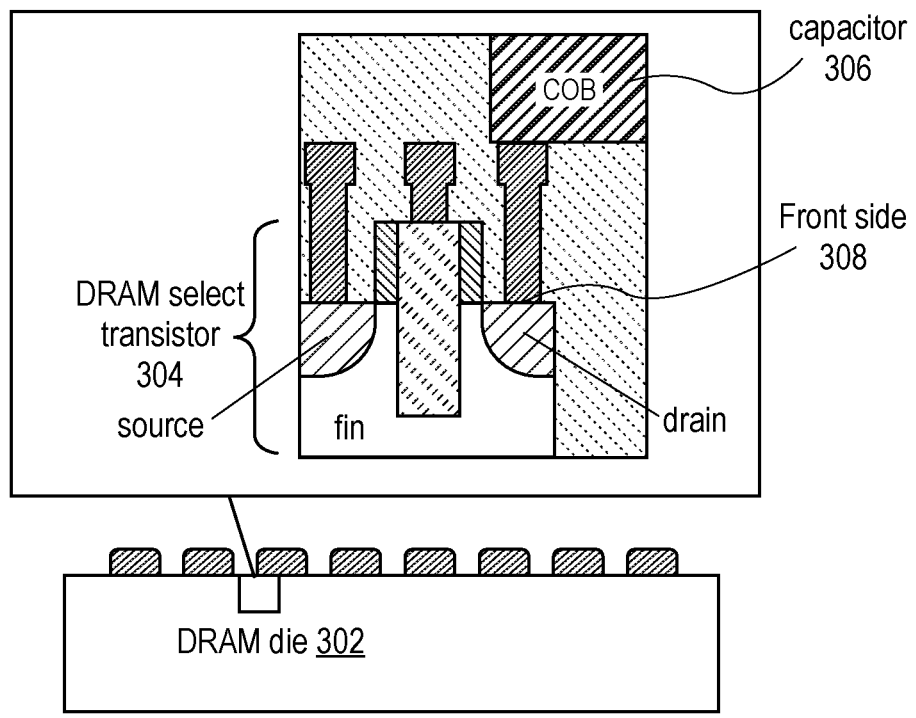
FIG. 3A illustrates an example of a select transistor and capacitor of a conventional DRAM.

FIG. 3A illustrates an example of a select transistor and capacitor of a conventional DRAM. The DRAM die 302 includes a single layer of DRAM select transistors 304 and capacitors 306 over the select transistors 304. In the illustrated example, the source and drain of the transistor 304 are on the same side (e.g., the front side) 308 of the transistor and the capacitor 306 is formed over the transistor 304 with the front end or front side 308 of the transistor 304. With the source and drain both on the front side and the capacitor over the front side of the transistor, connections from the bottom to the top of the transistor are blocked, limiting the DRAM die to a single DRAM layer.

Figure 3B:
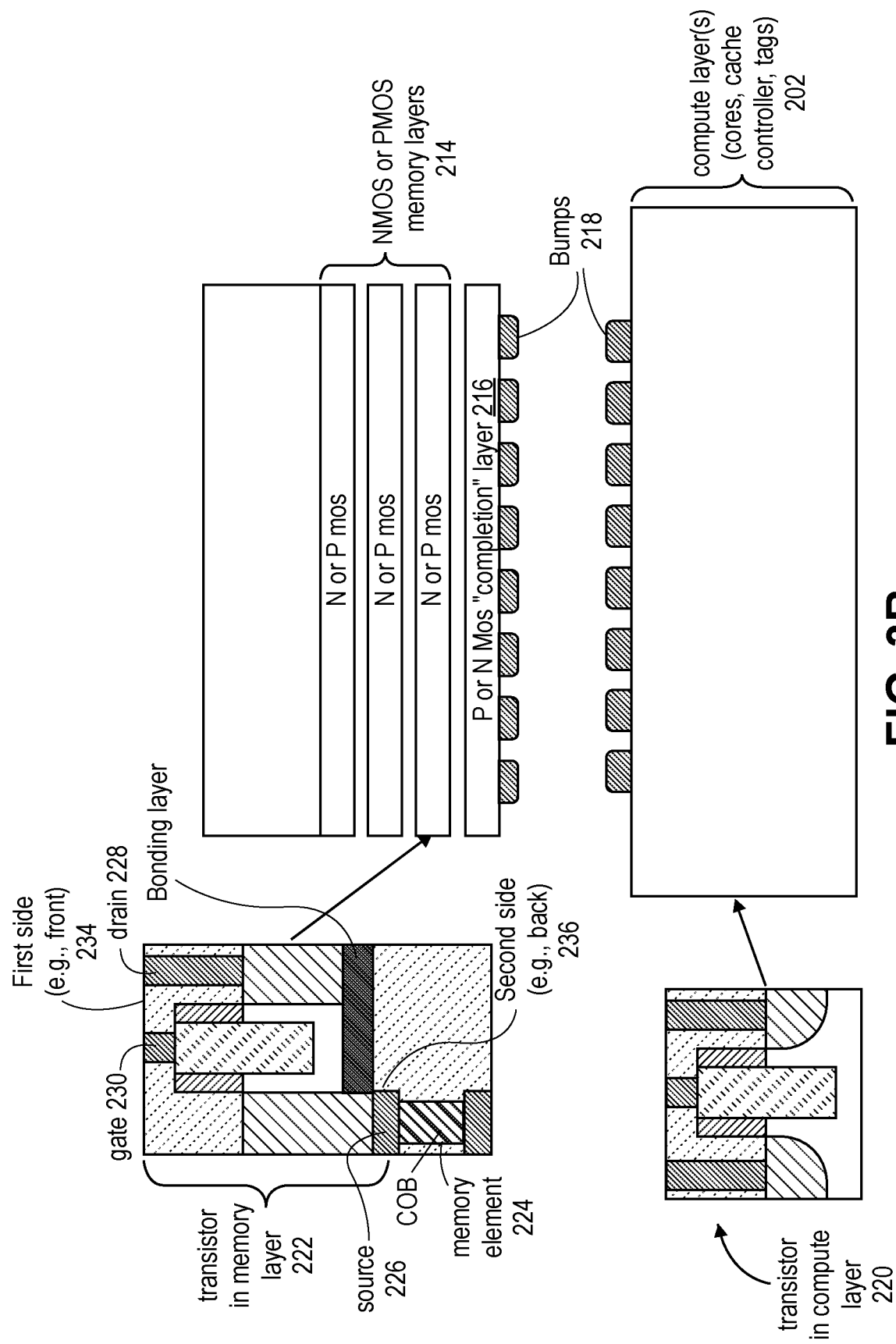
FIG. 3B illustrates an example of a select transistor for NMOS or PMOS memory layers.

In contrast, FIG. 3B illustrates an example of a select transistor and a memory element for NMOS or PMOS memory layers that enable stacking many memory layers. FIG. 3B illustrates a select transistor 222 of an NMOS or PMOS memory layer (e.g., one of memory layers 214 of FIG. 2) and a transistor 220 that may be formed in the compute layer 202. As mentioned above with respect to FIG. 2, the NMOS or PMOS memory layers include both a memory element and select transistor in series with the memory element. The select transistor enables access (e.g., reading and writing) to the memory element. The select transistor 222 includes a source 226, a gate 230, and a drain 228. The transistor is coupled with a memory element 224. In the illustrated example, the memory element 224 is a capacitor (e.g., capacitor over bitline (COB)). Thus, in the illustrated example, a small memory cell is implemented with a capacitor 224 buried under the transistor 222. However, the memory element 224 may be any memory element capable of storing one or more bits. For example, the memory element may include: a volatile memory element, a non-volatile memory element, a dynamic random-access memory DRAM element, a capacitor, a chalcogenide-based memory element, a phase change memory (PCM) element, a nanowire memory element, a ferroelectric transistor random access memory (FeTRAM), magneto resistive random access memory (MRAM), a memory element that incorporates memristor technology, a spin transfer torque MRAM (STT-MRAM) element, a qubit (quantum bit) element, or a combination of one or more of the above, or other memory types.

Unlike conventional transistors that include source and drain terminals that are located and connected on the same side (e.g., front side) in roughly the same plane, the select transistors in each of the memory layers 214 include transistors that have a source and drain in different planes, enabling multiple memory layers to be stacked over one another and connected together.

For example, FIG. 3B illustrates an example of a transistor 222 that may be formed in one of the memory layers 214. The select transistor 222 is this example has a source and drain at opposite sides of the transistor. In the illustrated example, the drain 228 is located and connected at one plane or side 234 (e.g., the front) of the transistor 222 and the source is located and connected at a second plane side 236 (e.g., the back) of the transistor 222. In another example, the source is located and connected at the front side of the transistor 222 and the drain is located and connected at the back side of the transistor 222. The location of the contact 226 at the opposite side of the transistor relative to the other contact 228 enables connecting bitlines in a vertical manner (e.g., through the transistor from the backside contact 226 to the frontside contact 228 to build many interconnected layers of NMOS or PMOS transistors).

Figure 4A:
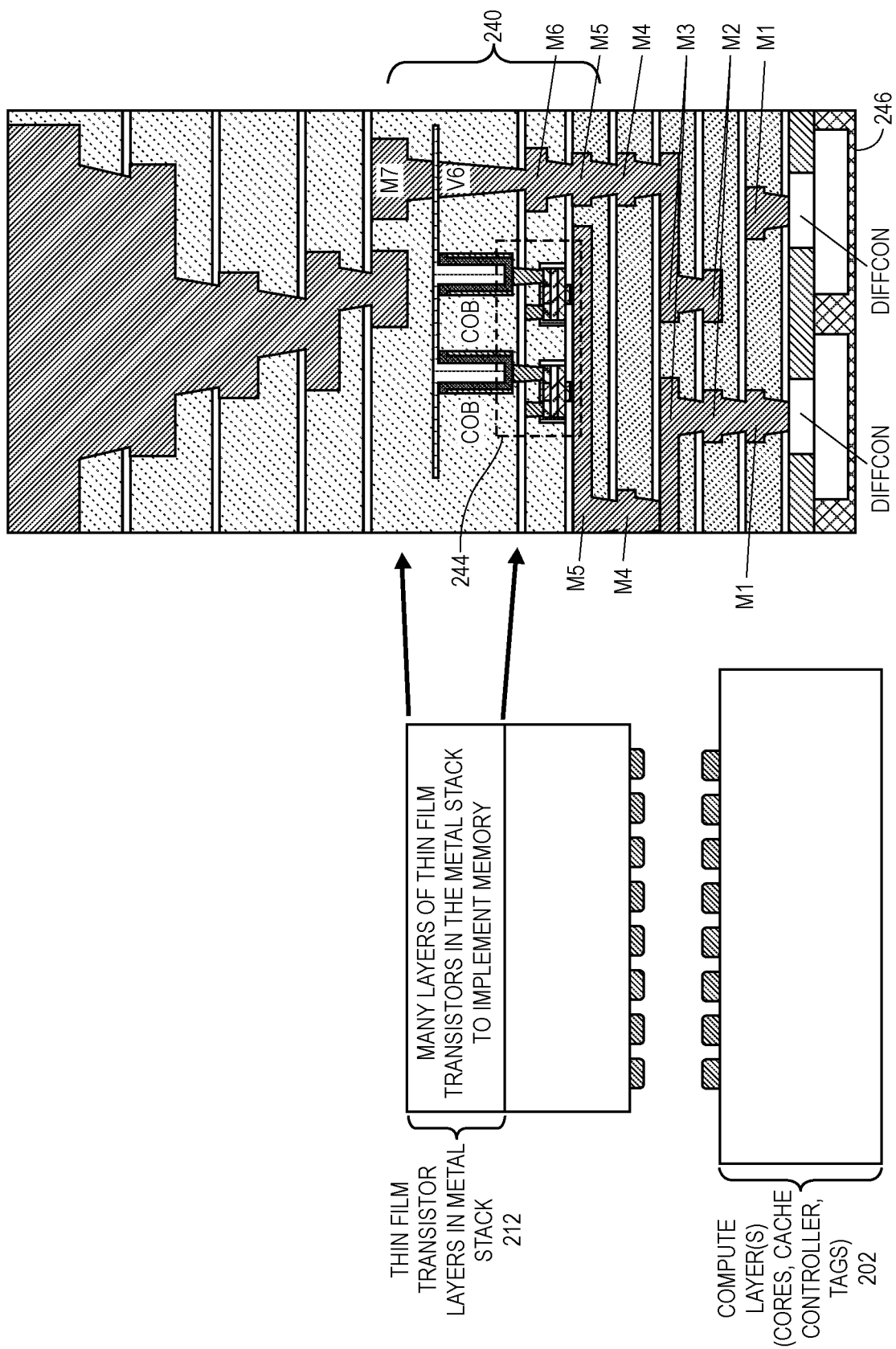
FIG. 4A illustrates an example of memory layers in the interconnect stack.
Figure 4B:
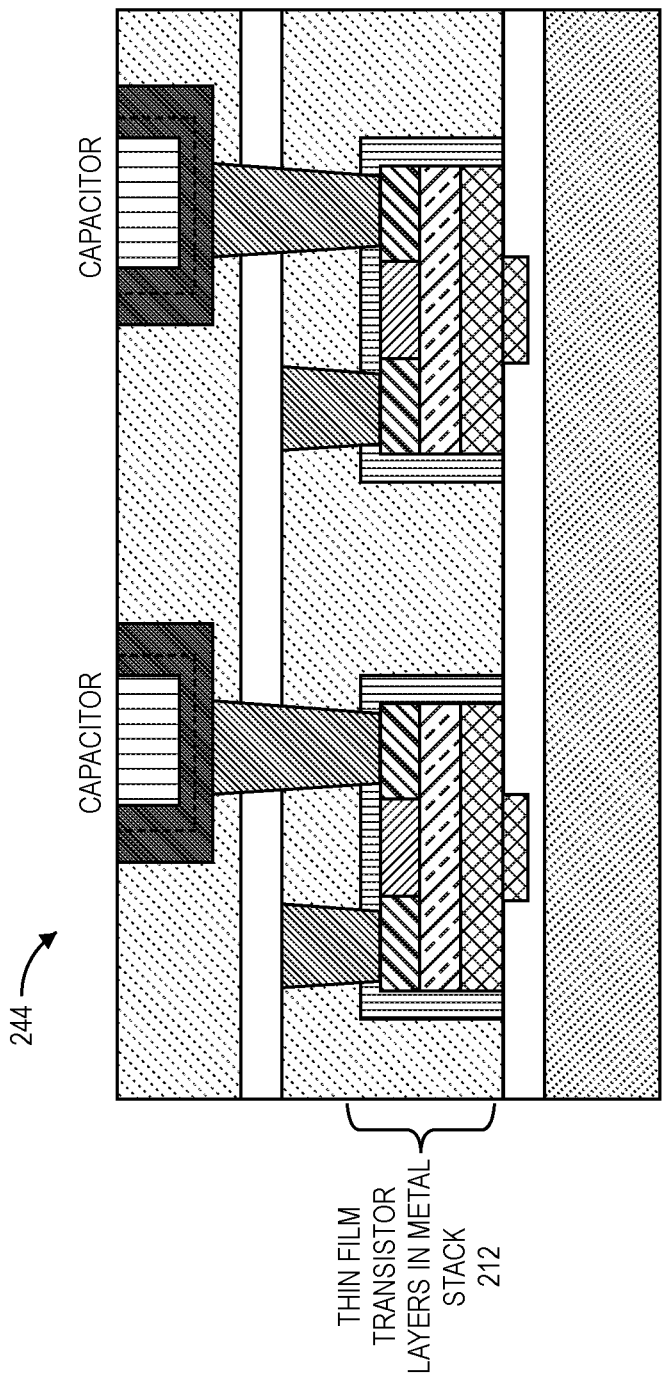
FIG. 4B illustrates an enlarged view of the box 244 of FIG. 4A.

FIG. 4A illustrates an example of memory layers formed in the interconnect stack. In one example, the memory layers 212 in the interconnect stack include multiple layers of thin film transistors (see box 244) over on a silicon substrate 246 to provide a memory array 240 for a 3D DRAM. The memory layers 240 may be fabricated in between the interconnect or metal layers. As shown in more detail in FIG. 4B, the memory cell may include one transistor and one capacitor to form a DRAM select transistor and capacitor in series. The transistors in the metal interconnects may be, for example, thin film transistors or silicon transistors that are fabricated at low temperatures. Although FIGS. 4A and 4B show a capacitor as the memory element, memory layers in the interconnect stack may be formed with other memory elements, such as the memory elements discussed above with respect to FIG. 3B.

Turning again to FIG. 4A, in the illustrated example, the bottom layers include the substrate 246, which includes diffusion contact (diffcon) material. The die on which the memory layers are formed may include alternate layers of interconnect (M) layers and interlayer (V) layers. In the illustrated example, the transistors for the memory cell array 240 are located between metal layers. In the illustrated example, the capacitors for the memory cells are located in an interlayer layer. Additional metal layers may be located over the array 240. Thus, the array is located between metal layers. Although FIG. 4A shows only one tier or layer of memory cells, the memory may include multiple tiers or layers of memory cells stacked over one another.

The memory layers 212 may be fabricated on a back side of the substrate 246 and coupled to the CMOS circuitry on the front side of the substrate 246 with TSVs (through silicon vias). In one example, the memory array 240 may be mirrored on both sides of the silicon substrate 246. Because the physical array may be fabricated separately from silicon substrate 246, the memory layers may be formed on either or both the front side and back side of the silicon substrate 246. The memory layers may be bonded to the compute layers 202.

Figure 5A:
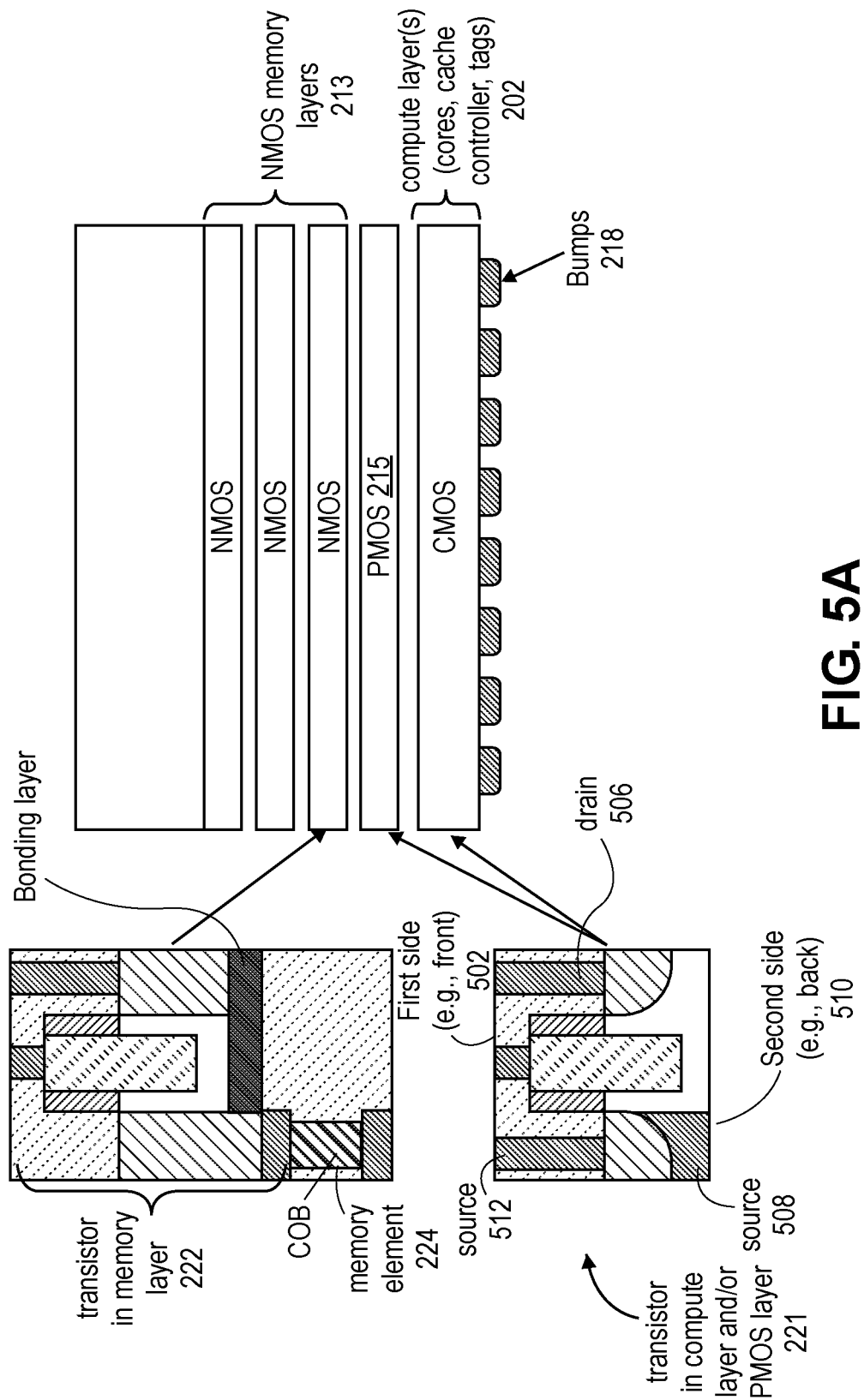
FIGS. 5A-5C illustrate variations of 3D compute with integrated 3D DRAM.
Figure 5B:
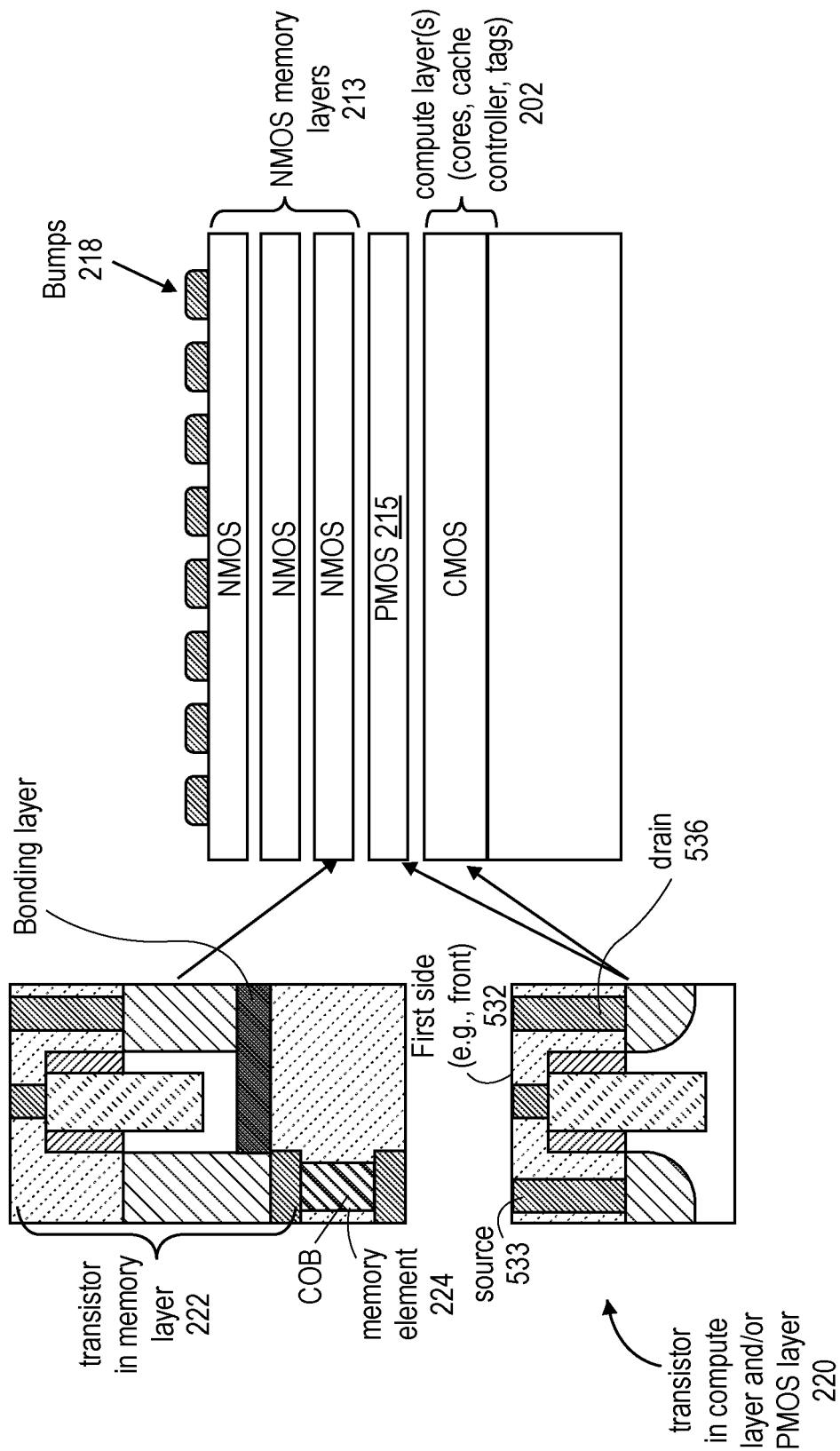
Figure 5C:
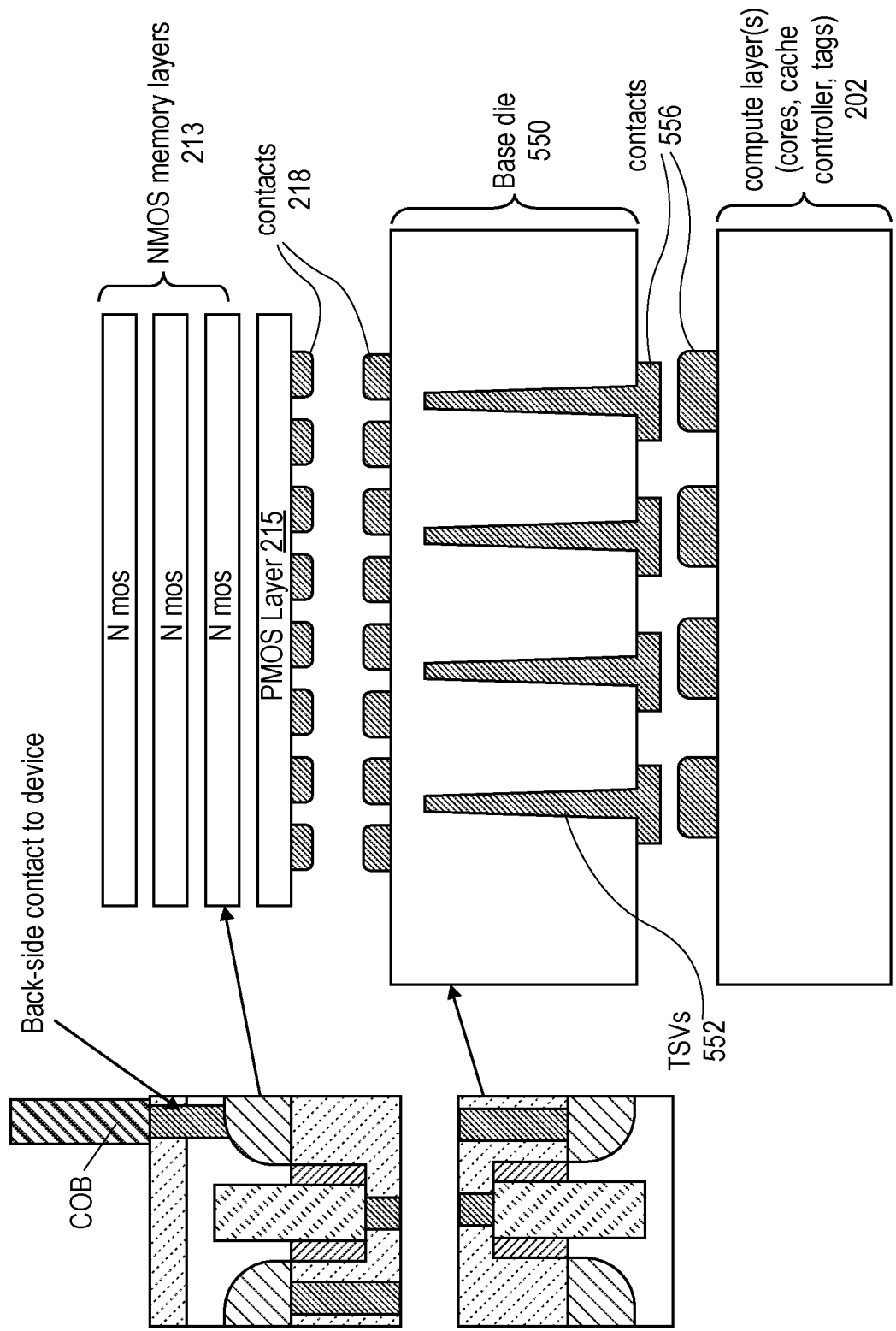

FIGS. 5A-5C illustrate variations of 3D compute with integrated 3D DRAM. In FIGS. 5A-5C, the 3D compute with integrated 3D memory devices include NMOS memory layers 213, a PMOS completion layer 215, and compute layers 202. Like the memory layers 214 discussed above with respect to FIG. 2, each of the NMOS layers 213 is a memory layer with both memory elements 224 and select transistors 222. The PMOS layer 215 provides PMOS transistors for the memory control circuitry. Although the examples in FIG. 5A-5C show the memory layers as NMOS memory layers, other examples may include PMOS memory layers and an NMOS completion layer. The CMOS layers 202 include compute circuitry, such as the processor cores, cache control logic, and SRAM for one or more caches. FIG. 5A illustrates an example of a 3D compute with integrated 3D DRAM in which power is supplied from the bottom. In the illustrated example, the transistors in the NMOS memory layers 213, the PMOS layer 215, and the compute layers 202 have connections on both sides (front and back ends) to enable a connection through the transistor from one layer to another, enabling all the layers 213, 202, and 202 to be connected and enabling power delivery from the bottom via bumps 218 through all the layers.

In the example of FIG. 5A, the power is to be supplied from below the compute layers 202 via bumps 218, which interface with a package and/or underlying PCB (printed circuit board). As mentioned above, the transistors in the compute layers 202 and the PMOS layer 215 include transistors with connections on both sides or ends to enable connections through and between layers. In the example illustrated in FIG. 5A, the PMOS completion layer 215 and the compute layers 202 may include a transistor such as transistor 221. The transistor 221 includes contacts on both ends (e.g., front and back). As mentioned above, typically, transistors are connected with source and drain at the top or front side of the transistor. The transistor 221 includes a source 512 and drain 506 on the front side and a contact 508 at the back side 510. The source 512 and drain 506 on the front side 502 enable the transistor 221 to be connected and operated with the contacts at the front side, and the source 508 on the back side 510 enables the transistor to be operated from back end to front end (or front end to back end) to connect adjacent layers through the transistor 221. Thus, the transistor 221 can operate with the source 512 or the source 508.

FIG. 5B illustrates an example in which the power is supplied from the top. For example, power is delivered via bumps 218, which interface with a package, through and to the NMOS memory layers 213, the PMOS layer 215, and the compute layers 202. Because power is not being supplied from the bottom through the compute layers, the transistors 220 in the compute layers may include source 533 and drain 536 on the same side or end (e.g., front side 532) of the transistor.

FIG. 5C illustrates another 3D compute device with integrated 3D memory. In the example illustrated in FIG. 5C, many memory layers 213 are added to a base die 550. The NMOS memory layers 213 and the PMOS layer 215 may be added to the base die 550 via a layer transfer process, or memory layers may be deposited on the base die 550. In one example, the NMOS memory layers include silicon layers (e.g., single-crystal silicon) with memory elements and NMOS transistors. In one such example, the silicon-based memory layers are transferred to the base die via a layer transfer process. In one such example, the orientation of the select transistors and the memory elements may be reversed, as shown in FIG. 5C. In another example, the NMOS layers 213 include thin film transistors with a memory element. In one such example, the thin film transistors include active materials (e.g., poly silicon, amorphous silicon, indium gallium zirconium oxide, TMDs (transition metal dichalcogenides), or other active materials) that are deposited on the base die 550 to form the thin film transistors on the base die 550. The base die 550 includes TSVs (through silicon vias) 552 to connect memory layers 213, the PMOS layer 215, and memory layers in the base die 550 with the compute layers 202. The base die 550 and compute layers 202 may be bonded together via contacts 556 using bonding techniques. Although FIG. 5C illustrates an example in which the base die is over the compute die, a base die may be under one or more compute dies or over a compute die.

Thus, a 3D DRAM may be integrated with compute logic to provide high density and low cost DRAM to enable high performance, low latency and low power at a low cost. By supporting a large number of memory layers, low cost memory can be integrated with the processor at low costs. By decoupling memory from CMOS, a simplified process for fabricating integrated memory can be achieved that is a fraction of the cost of conventional processes. In one example, the memory is decoupled, but tightly integrated due to the computes implemented in the CMOS layers. In one example, the compute layers support high performance microprocessor design. In one example, the memory layers include memory cells with only a single NMOS transistor with a memory element or a single PMOS transistor with a memory element, where each layer is only NMOS or only PMOS. The 3D DRAM may be used to create a low latency cache that is tightly integrated with a microprocessor to create high performance designs (e.g., high performance processors or very wide machines). The integrated 3D DRAM may be implemented for a variety of applications such as artificial intelligence (AI) processors or accelerators, graphics (e.g., graphics processing units (GPUs) or graphics accelerators), vision processing units (VPUs), etc.

Figure 6B:
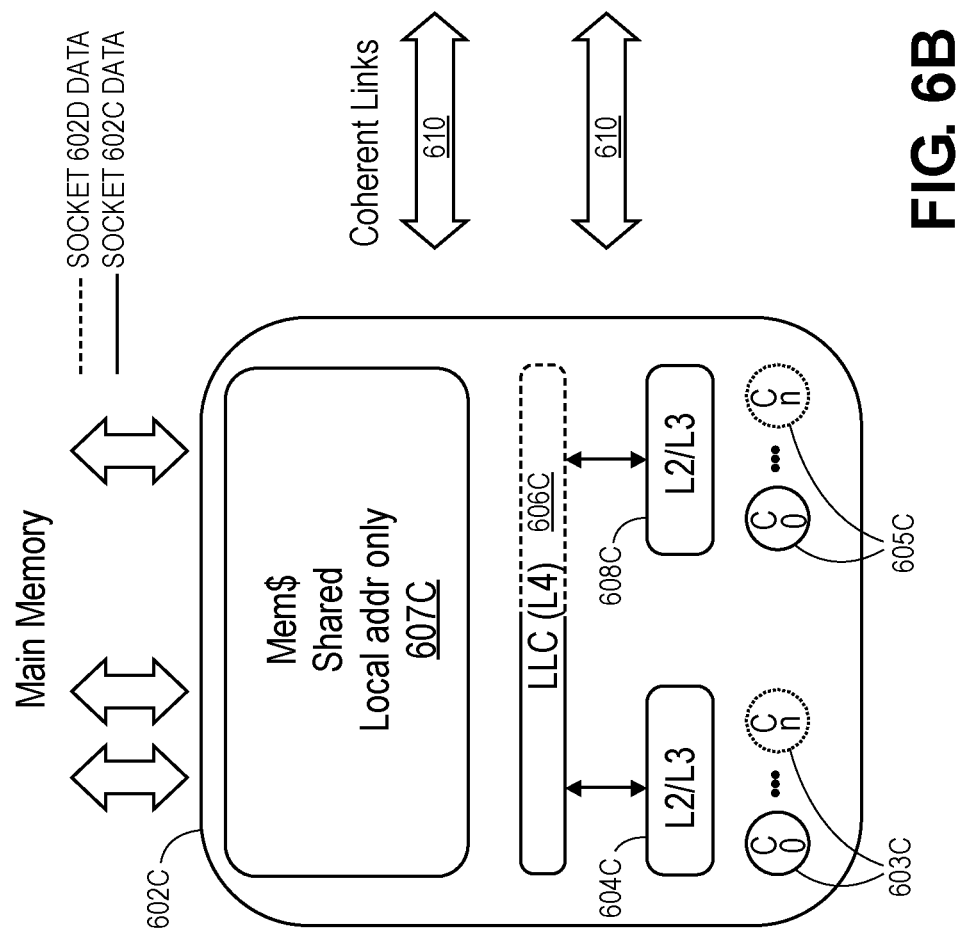

As mentioned above, one application of 3D DRAM is to form one or more 3D caches over or under high performance logic in a 3D monolithic fashion. FIGS. 6A and 6B illustrates examples of cache hierarchies with integrated 3D DRAM caches.

FIG. 6A illustrates an example of a shared cache hierarchy with integrated 3D DRAM caches. The shared cache hierarchy in FIG. 6A has two sockets 602A and 602B connected via coherent links 610. Thus, the sockets 602A and 602B share the same memory address map and the snoop filter tracks data from socket 602A's local memory and socket 602B's local memory. Each socket has processor cores. In the illustrated example, the processor cores for each socket are in groups that share one or more levels of cache. For example, the socket 602A has two groups 603A and 605A of cores, and the socket 602B has two groups 603B and 605B of cores. In the illustrated example, each group 603A, 605A, 603B, and 605B has one to N cores (cores 1-*n*). Groups of cores can share a cluster of cache, such as the L2 and/or L3 caches. For example, the cores in the group 603A share the L2/L3 cache 604A and the cores in the group 605A share the L2/L3 cache 608A. Similarly, the cores in the group 603B share the L2/L3 cache 604B, and the cores in the group 605B share the L2/L3 cache 608B. The L2 and L3 caches can be inclusive or non-inclusive.

Unlike conventional cache hierarchies, the cache hierarchy illustrated in FIG. 6A includes a large level 4 (L4) cache implemented with the integrated 3D DRAM on package with the cores. For example, the L4 cache 606A is on the same package as the groups 603A and 605A of cores, and the L4 cache 606B is on the same package as the groups 603B and 605B of cores. In the example illustrated in FIG. 6A, all the cores in a socket share the same L4 cache. In one example, the L4 cache is the last level cache (LLC). For example, the cores in the groups 603A and 605A share the same L4 cache 606A and the cores in the groups 603B and 605B share the same L4 cache 606B. The cores in each socket can also access local memory or remote memory. Thus, the on-package L4 cache 606A can store cachelines from the local memory (e.g., socket 602A's local memory) and remote memory (e.g., socket 602B's local memory). Similarly, the on-package L4 cache 606B can store cachelines from the local memory (e.g., socket 602B's local memory) and remote memory (e.g., socket 602A's local memory).

FIG. 6B illustrates another example of a cache hierarchy with integrated 3D DRAM caches. Like FIG. 6A, the cache hierarchy of FIG. 6B includes two sockets 602C and 602D connected via coherent links 610. The sockets 602C and 602D share the same memory address map and the snoop filter tracks data from socket 602C's local memory and socket 602D's local memory. Each socket has processor cores. In the illustrated example, the processor cores for each socket are in groups that share one or more levels of cache. For example, the socket 602C has two groups 603C and 605C of cores, and the socket 602D has two groups 603D and 605D of cores. In the illustrated example, each group 603C, 605C, 603D, and 605D has one to N cores (cores 1-n). Groups of cores can share a cluster of cache, such as the L2 and/or L3 caches. For example, the cores in the group 603C share the L2/L3 cache 604C and the cores in the group 605C share the L2/L3 cache 608C. Similarly, the cores in the group 603D share the L2/L3 cache 604D, and the cores in the group 605D share the L2/L3 cache 608D. The L2 and L3 caches can be inclusive or non-inclusive.

The cache hierarchy illustrated in FIG. 6B also includes a level 4 (L4) cache. For example, the L4 cache 606C is on the same package as the groups 603C and 605C of cores, and the L4 cache 606D is on the same package as the groups 603D and 605D of cores. In the example illustrated in FIG. 6B, all the cores in a socket share the same L4 cache. For example, the cores in the groups 603C and 605C share the same L4 cache 606C and the cores in the groups 603D and 605D share the same L4 cache 606D. The cores in each socket can also access local or remote memory. Thus, the on-package L4 cache 606C can store cachelines from the local memory (e.g., socket 602C's local memory) and remote memory (e.g., socket 602C's local memory). In one example, the L4 cache is the last level cache (LLC).

Also like FIG. 6A, the cache hierarchy of FIG. 6B includes a large on-package cache implemented with the integrated 3D DRAM on package with the processor cores. For example, the socket 602C has a memory-side cache 607C on the same package as the processor cores 603C and 605C. Similarly, the socket 602D has a memory-side cache 607D on the same package as the processor cores 603D and 605D. In one example, the memory-side caches 607C and 607D are on the same package as an integrated memory controller and logically between the processor cores and the integrated memory controller and the memory to cache cachelines from an off-package memory. In the example illustrated in FIG. 6B, the memory-side caches store only local memory addresses. For example, the memory-side cache 607C only stores cachelines from the socket 602C's local memory. Similarly, the memory-side cache 607D only stores cachelines from the socket 602D's local memory. Thus, the cache architecture in FIG. 6B includes an L4 cache and a memory-side cache in integrated 3D DRAM. Although the L4 cache is shown as being smaller than the memory-side cache, the figures are not to scale; the L4 cache may be smaller, the same size, or larger than the memory-side cache. In another example, the cache hierarchy includes a memory-side cache (e.g., memory-side cache 607C or 607D) in the integrated 3D DRAM, and not an L4 cache.

Although the example in FIGS. 6A and 6B show two sockets, cache hierarchies with one or more caches formed from an integrated 3D DRAM may include a different number of sockets (1, 4, etc.). Additionally, although FIGS. 6A and 6B illustrate an integrated L4 and memory-side cache, the techniques described herein may apply to any level of large integrated cache (e.g., L4, L5, memory-side, etc.), which may be the last level cache (LLC).

As mentioned above, a cache hierarchy including a large integrated L4 cache or memory-side cache can have a significant tag overhead. Considering an example with 64B cachelines, the tag for each cacheline may be consume, for example, several bytes for each cacheline. For an L4 or memory-side cache that is tens or hundreds of times the size of a conventional integrated cache, the tag overhead alone can occupy the space of a conventional cache (e.g., tens of megabytes). Additionally, cache lookup operations for a large L4 or memory-side cache may result in delays due to the large number of entries in the cache.

One or more tag caches can enable faster cache access by enabling bypassing the tag lookup (e.g., tag access and comparison) in the L4 and memory-side caches. FIGS. 7A and 7B illustrate examples block diagrams of tag caches. FIG. 7A illustrates an L4 tag cache 702, and FIG. 7B illustrates an example of a memory-side tag cache 704. The L4 cache 706 and the memory-side cache 708 may be the same as or similar to, the L4 cache 117 and the memory-side cache 119 of FIG. 1E, discussed above. The L4 cache 706 stores data cachelines (e.g., Data1, Data2 . . . Data N) and associated tag and state information (e.g., Tag 1, Tag 2 . . . Tag N). The tag includes an identifier or description of the address of the associated data cacheline. Similarly, the memory-side cache 708 stores data cachelines and associated tags and state information. The caches may be organized as multiple banks 705 and 707. Within the banks, the caches may be organized in multiple sets, ways, etc. Thus, the memory-side cache 708 may include or be organized as multiple memory-side cache banks 707. The L4 cache 706 may include or be organized as multiple L4 cache banks. In one example, the banks are concurrently accessible. Other cache organizations are possible.

The L4 tag cache 702 stores tags of recently accessed cachelines from the L4 cache. Similarly, the memory-side tag cache 704 stores tags of recently accessed cachelines from the memory-side cache 708. The tag caches 702 and 704 are examples of the tag cache(s) 113 of FIG. 1E. The L4 tag cache 702 and the memory-side tag cache 704 may be implemented in SRAM on the compute logic (e.g., processor). In one example, the tag caches 702 and 704 are organized in banks 709 and 713 that correspond to the banks of the caches 706 and 708. For example, the L4 tag cache 702 may be organized as the same number of banks as the L4 cache 704, and the banks of the L4 tag cache 702 correspond to the banks of the L4 cache (e.g., bank 0 of the tag cache 702 corresponds to the bank 0 of the L4 cache 704). Similarly, the memory-side tag cache 704 may be organized as the same number of banks as the memory-side cache 708, and the banks of the memory-side tag cache 704 correspond to the banks of the memory-side cache 708. In another example, multiple cache banks may correspond to a tag cache bank. For example, the L4 tag cache 702 may have fewer banks than the L4 cache, and multiple banks (e.g., 2 or more of the banks 705) correspond to each of the banks 709 of the L4 tag cache.

Regardless of the organization, the tag caches 702 and 704 store a subset of tags from the corresponding caches. In the illustrated example, Tag 2 in the L4 cache was recently accessed and inserted into the L4 tag cache 702. If another memory access request is received with an address that matches Tag 2, the data (e.g., Data 2) can be directly accessed without accessing and comparing tags in the L4 cache. In the illustrated example, location information (e.g., an index, a pointer, a reference, or other location information) is associated with each tag in the L4 tag cache to identify the location of the data associated with the tag in the L4 cache. Similarly, each entry in the memory-side tag cache includes location information to identify the location of the data associated with the tag in the memory-side cache. Although the example illustrated in FIGS. 7A and 7B show L4 and memory-side caches, tag caches may be used for any level of large integrated cache.

Figure 8A:
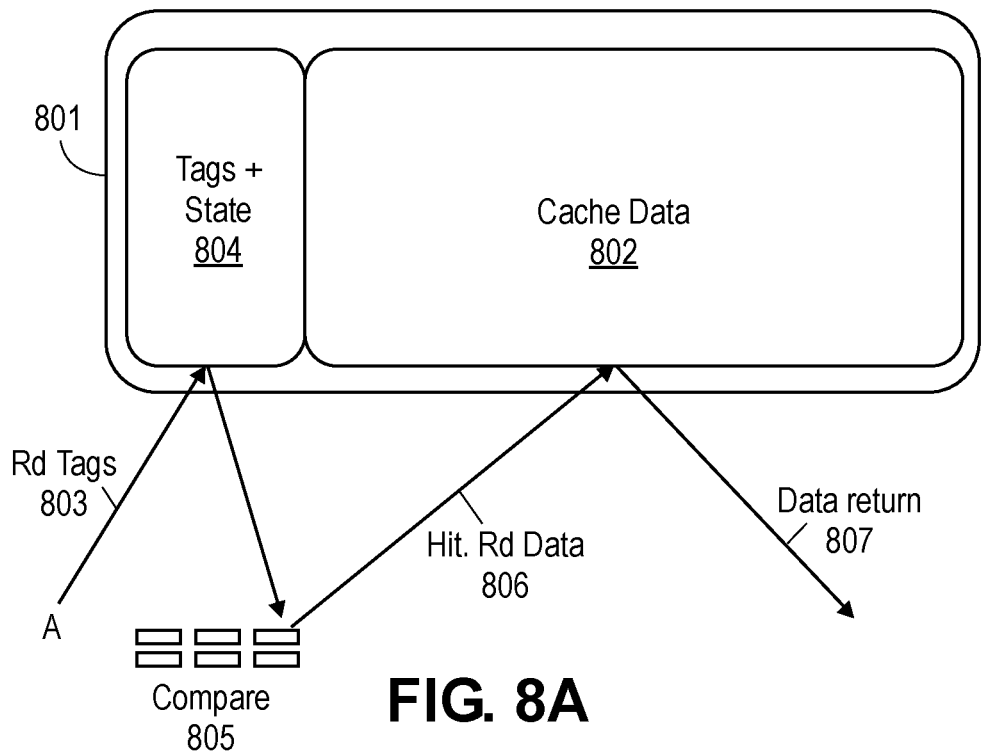
FIGS. 8A and 8B illustrate examples of cache access flows.
Figure 8B:
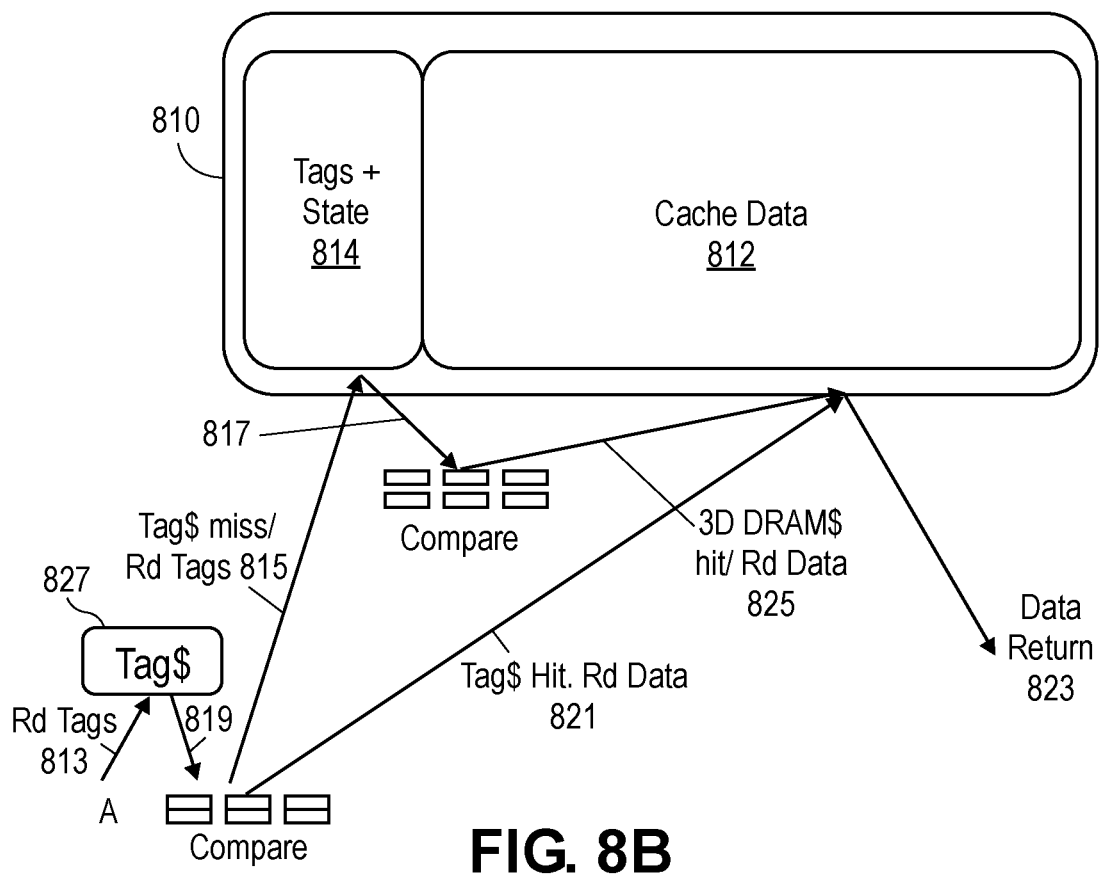

FIGS. 8A and 8B illustrate examples of cache access flows. FIG. 8A illustrates a conventional cache access flow. FIG. 8B illustrates a cache access flow with a tag cache. Both FIGS. 8A and 8B illustrate a cache with cache data, tags, and state information. For example, FIG. 8A illustrates a cache 801 that stores cache data 802 and tags and state information 804. Similarly, FIG. 8B illustrates a cache 810 that stores cache data 812 and tags and state information 814. The cache 810 of FIG. 8B may be, for example, an L4 cache or a memory-side cache implemented in integrated 3D DRAM.

Turning first to FIG. 8A, a cache controller receives an address (A), reads tags (803) from the cache 801, and compares (805) the address to the tags. If there is a hit (806), the cache controller retrieves the data from the cache 801 and returns the data (807) to the requesting processor core.

In contrast, the flow in FIG. 8B involves the cache controller receiving an address (A) and reading tags (813) from a tag cache 827. The tag cache 827 may be implemented in SRAM. The address is compared (819) with the tags read from the tag cache 827. If there is a miss in the tag cache 827, then the cache controller reads the tags (815) from the 3D DRAM cache 810. The address can then be compared (817) with the tags from the 3D DRAM cache 810, and if there is a hit in the 3D DRAM cache 810, the data can be retrieved (825) from the 3D DRAM cache 810. In one example, the cache controller fills the tag read from the 3D DRAM cache 810 into the tag cache 827. In one example, filling the tag cache involves storing the matching tag from the 3D DRAM cache into the tag cache. If there is a hit in the tag cache 827, the cache controller retrieves the data (821) directly from the cache 810 without reading or comparing tags from the cache 810. The data can then be returned (823) to the requester. Because the tag cache 827 is smaller and implemented in SRAM, the reading and comparison of tags to the address is faster than reading and comparing tags from the larger DRAM cache 810. Thus, access times to the larger integrated 3D DRAM cache 810 can be significantly improved.

Figure 9A:
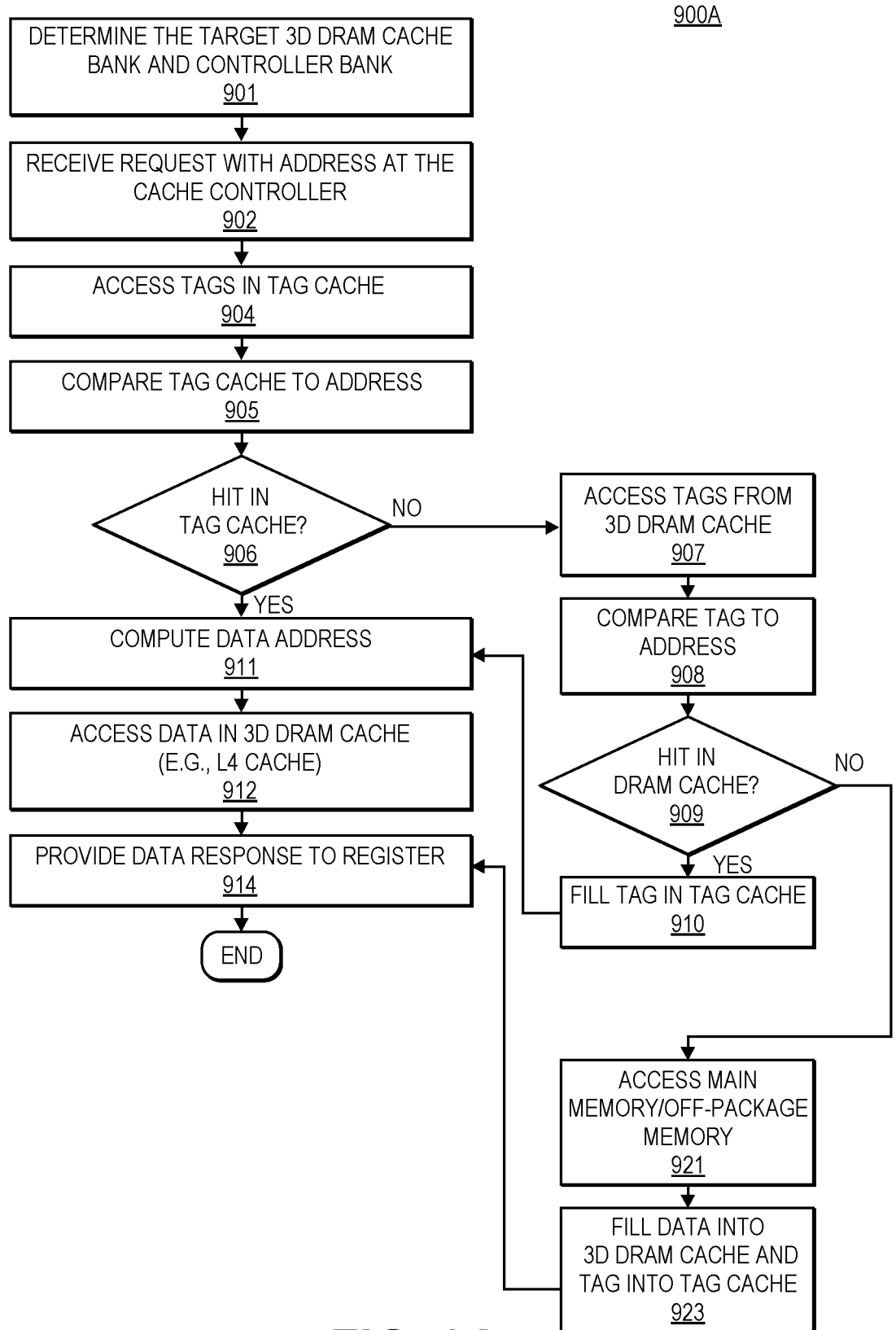
FIGS. 9A and 9B are flow diagrams illustrating examples of cache access flows with a tag cache.
Figure 9B:
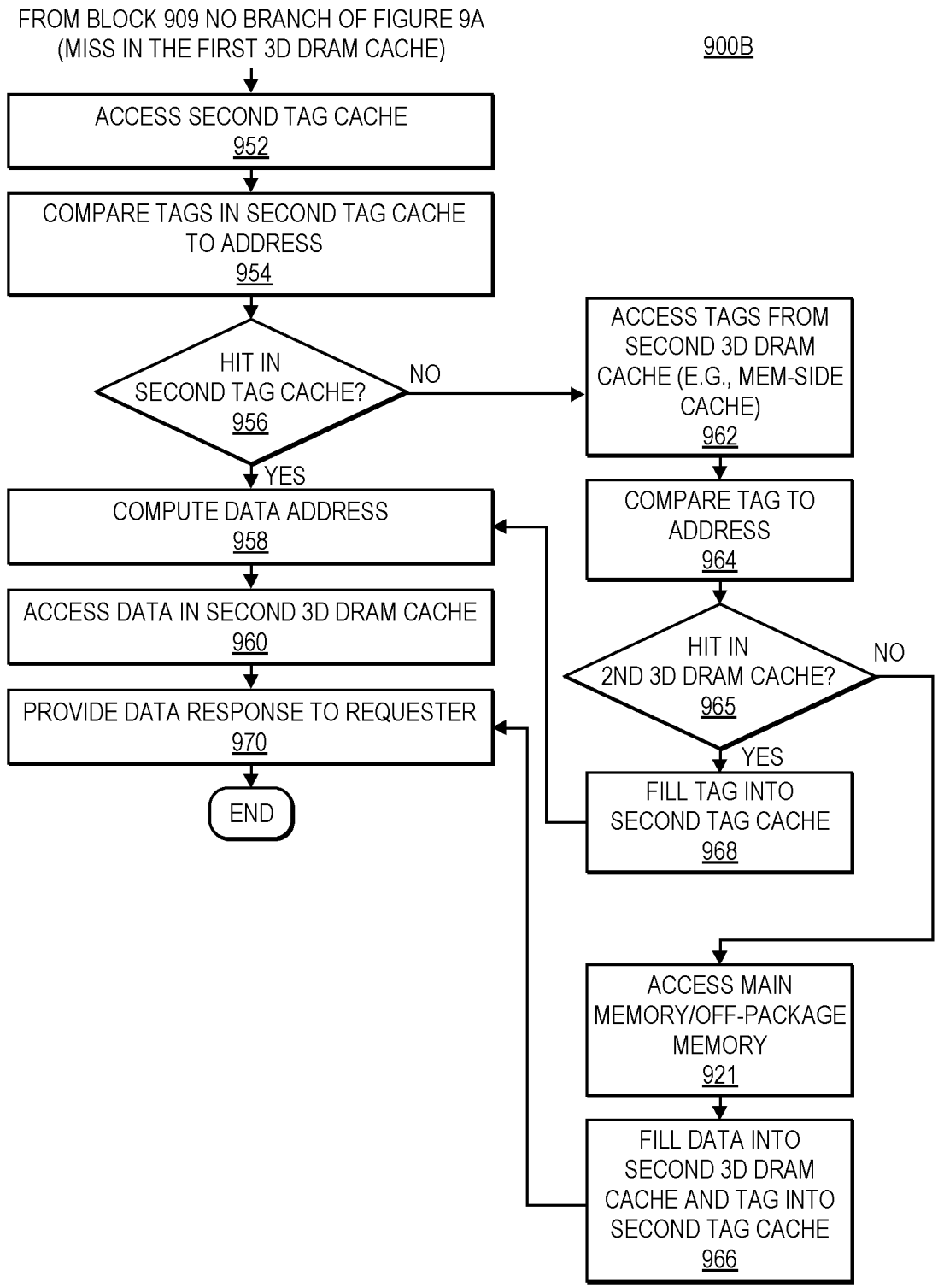

FIGS. 9A and 9B are flow diagrams illustrating examples of cache access flows with a tag cache. The method 900A of FIG. 9A and 900B of FIG. 9B may be performed by hardware logic (e.g., circuitry), firmware, or a combination of hardware and firmware. For example, circuitry in a processor or other compute logic such as the cache controller 115 of FIG. 1E may perform the cache access flow 900A.

The flow 900A begins with a requester (such as a processor core) sending a request to access and address and determining the target 3D DRAM cache bank and controller bank based on the address, at 901. For example, in a system with a banked L4 cache implemented in integrated 3D DRAM (e.g., an L4 cache that includes multiple L4 cache banks), the cache controller may be organized as corresponding cache controller banks. Circuitry (which may be a part of the cache controller circuitry or separate from the cache controller circuitry) determines which of the multiple L4 cache banks is targeted by the address and sends the request to one of the multiple cache controller banks corresponding to the L4 cache bank targeted by the address. In one example, the target cache bank and controller bank is determined by performing an address hash of the request address to determine the specific cache bank and controller bank targeted by the address. However, in other examples, the 3D DRAM cache is not banked, and therefore the request can be sent directed to the cache controller without determining the target bank.

The cache controller (or controller bank) receives the request with the address, at 902. The request can be, for example, a memory read or memory write request to access data at an address in memory (e.g., main memory). The cache controller accesses tags in the tag cache, at 904. For example, referring to FIG. 7A, the cache controller reads one or more tags from the tag cache 702. The cache controller then compares the tags from the tag cache with the address, at 905. In one example, the cache controller includes comparators to compare the address to one or more tags to determine if there is a match. In response to a hit in the tag cache, 906 YES branch, the cache controller computes the data address based on the tag, at 911, and accesses the data in the integrated 3D DRAM cache, at 912. For example, referring to FIG. 7A, the tag cache 702 includes location information associated with each tag that enables the cache controller to determine the data location and access the cacheline corresponding to the tag in the 3D DRAM cache. Thus, the cache controller can directly access data from the integrated 3D DRAM cache at a location indicated by an entry in the tag cache. The cache controller then provides a response to the requester, at 914. For example, the cache controller can provide the data to the requester, or indicate where the data is stored.

In response to a miss in the tag cache, 906 NO branch, the cache controller accesses tags from the 3D DRAM cache, at 907, and compares the tags to the address, at 908. For example, referring to FIG. 7A, the cache controller accesses tags in the L4 cache 706 and compares the tags to the address. If there is a hit in the 3D DRAM cache, 909 YES branch, the cache controller fills the tag into the tag cache, at 910. The cache controller can then compute the data address, at 911, access the data, at 912, and provide a data response to the requester, at 914.

If there is a miss in the 3D DRAM cache, 909 NO branch, the cache controller accesses the off-package memory to retrieve the data, at 921. The cache controller then fills the data and tag into the 3D DRAM cache and the tag into the tag cache, at 923. The controller can then provide a response to the requester, at 914.

FIG. 9B illustrates an example cache access flow in a system with two levels of cache in the integrated 3D DRAM. For example, referring to FIG. 6B, the cache hierarchy for the socket 602C includes an L4 cache 606C and a memory-side cache 607C. In one such example, in response to a miss in the L4 cache, a second tag cache is accessed before accessing tags in the memory-side cache. The method 900B of FIG. 9B begins from block 909 NO branch of FIG. 9A (a miss in the first 3D DRAM cache). If there is a miss in the first 3D DRAM cache, the cache controller accesses tags in a second tag cache, at 952, and compares the tags from the second tag cache to the address, at 954. For example, referring to FIG. 7B, if there is a miss in both the L4 tag cache 702 and the L4 cache 706, tags in the memory-side tag cache 704 are read and compared to the address.

In response to a hit in the second tag cache, 956 YES branch, the data address is computed and data from the memory-side cache is accessed, at 960, at a location indicated by an entry in the second tag cache. The cache controller can then provide a response to the requester, at 970. In response to a miss in the second tag cache, 956 NO branch, tags from the second 3D DRAM cache (e.g., the memory-side cache) are accessed, at 962, and compared to the address, at 964. If there is a hit in the second 3D DRAM cache, 965 YES branch, the tag is filled into the second tag cache, at 968. The data address can then be computed, at 958, the data can be accessed in the second 3D DRAM cache, at 960, and a response provided to the requester, at 970.

In response to a miss in the second 3D DRAM cache, 965 NO branch, the data is retrieved from off-package memory, at 921. The data and tag are then filled into the second 3D DRAM cache, and the tag is filled into the second tag cache. The cache controller can then provide a response to the requester, at 970. In one example, the data and tag can also be filled into the L4 cache and the tag can be filled into the first tag cache.

FIG. 10 is a block diagram illustrating an example of a cache access flow. FIG. 10 shows the flow over time between different domains or circuit blocks. In one example, the core executes a load instruction, computes the address, and checks the lower level caches (e.g., L1, L2, L3, etc.) for the address. If there is a miss, the core (e.g., core boundary 1002) sends the request via an interface to a mesh network and cache controller banks 1004. The controller banks send the request to the tag cache 1006 and determines whether there is a hit or miss the tag cache. If there is a miss in the tag cache, the second level tags 1008 (e.g. tags for the integrated 3D DRAM cache) are checked to determine whether there is a hit or miss. If there is a hit, tag fill circuitry 1010 fills the tag into the tag cache and the data is accessed from the integrated 3D DRAM cache 1012. The response and data is then sent via the mesh network to the core boundary 1014.

Thus, one or more large caches, such as an L4 and memory-side cache, may be integrated with the compute logic in the same package. One or more tag caches can be included in the compute logic to enable faster access to the L4 and memory-side caches. The following descriptions describe exemplary systems and architectures in which an integrated 3D DRAM cache may be implemented.

Figure 11A:
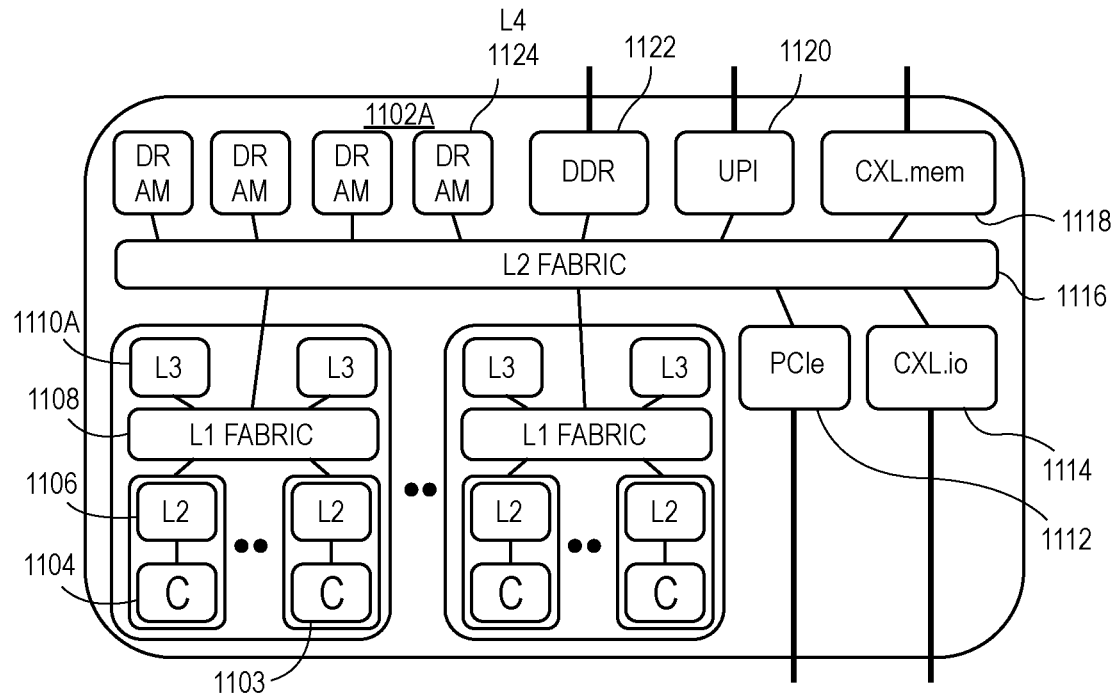
FIGS. 11A-11B illustrate block diagrams of examples of systems including cache hierarchies.
Figure 11B:
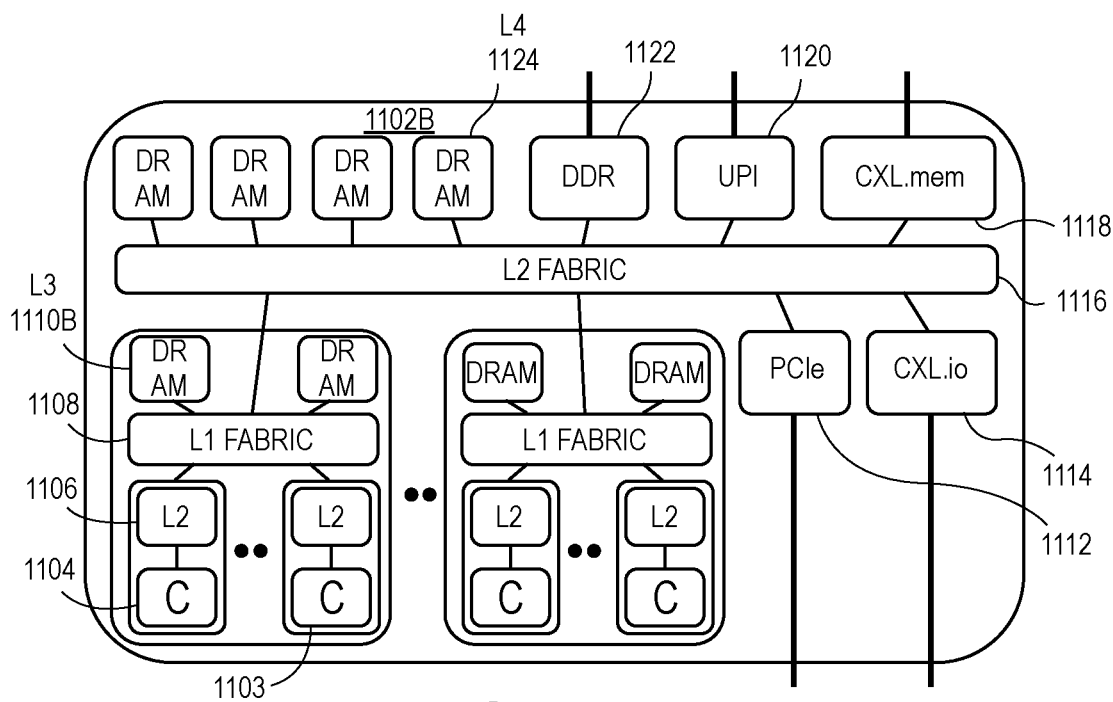

FIGS. 11A-11B illustrate block diagrams of examples of systems 1102A and 1102B including cache hierarchies. FIGS. 11A-11B each include processor cores 1104 and an L2 cache 1106 private to each core. A fabric 1108 couples the cores with L3 caches that are shared by a group of cores. The fabrics 1108 and 1116 couple the cores with an L4 cache, one or more memory controllers (e.g., DDR 1122 and CXL.mem 1118), coherent link logic (e.g., UPI 1120), and one or more I/O controllers (e.g., PCIe 1112 and CXL.io 1114). In the examples in FIGS. 11A-11B, the L4 cache is shared by all the cores (e.g., at the system or SOC (system on a chip) level). FIG. 11A illustrates an example in which the L4 cache 1124 is 3D DRAM integrated with the processor cores 1104, and the L3 cache 1110A is implemented in SRAM. FIG. 11B illustrates an example in which both the L4 cache 1124 and the and the L3 cache 1110B is 3D DRAM integrated with the processor cores 1104. In an example in which the L3 cache is implemented in 3D DRAM, a third tag cache may be used to store recently accessed tags from the L3 cache.

Figure 12A:
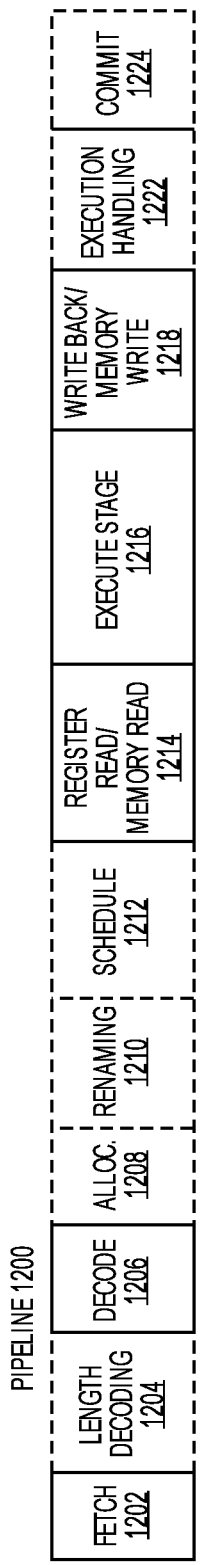
FIG. 12A is a block diagram illustrating both an exemplary in-order pipeline and an exemplary register renaming, out-of-order issue/execution pipeline.
Figure 12B:
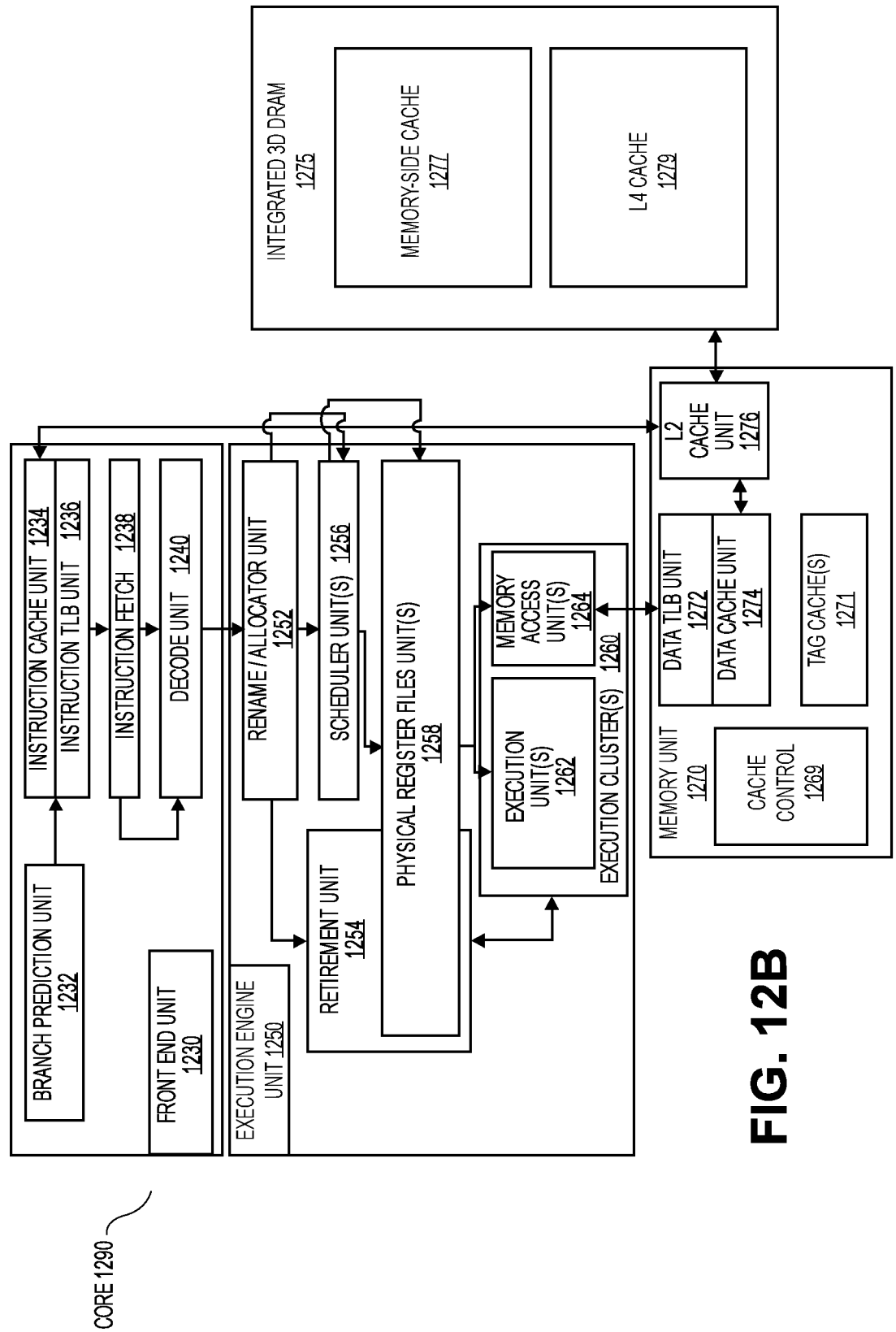
FIG. 12B is a block diagram illustrating both an exemplary embodiment of an in-order architecture core and an exemplary register renaming, out-of-order issue/execution architecture core to be included in a processor.

FIG. 12A is a block diagram illustrating both an exemplary in-order pipeline and an exemplary register renaming, out-of-order issue/execution pipeline. FIG. 12B is a block diagram illustrating both an exemplary in-order architecture core and an exemplary register renaming, out-of-order issue/execution architecture core to be included in a processor. The solid lined boxes in FIGS. 12A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 12A, a processor pipeline 1200 includes a fetch stage 1202, a length decode stage 1204, a decode stage 1206, an allocation stage 1208, a renaming stage 1210, a scheduling (also known as a dispatch or issue) stage 1212, a register read/memory read stage 1214, an execute stage 1216, a write back/memory write stage 1218, an exception handling stage 1222, and a commit stage 1224.

FIG. 12B shows processor core 1290 including a front end unit 1230 coupled to an execution engine unit 1250, and both are coupled to a memory unit 1270. The core 1290 may be an example of a core implemented in compute layers integrated with a 3D DRAM, such as the compute layers 202 of FIG. 2. The core 1290 may be a reduced instruction set computing (RISC) core, a complex instruction set computing (CISC) core, a very long instruction word (VLIW) core, or a hybrid or alternative core type. As yet another option, the core 1290 may be a special-purpose core, such as, for example, a network or communication core, compression engine, coprocessor core, general purpose computing graphics processing unit (GPGPU) core, graphics core, or the like.

The front end unit 1230 includes a branch prediction unit 1232 coupled to an instruction cache unit 1234, which is coupled to an instruction translation lookaside buffer (TLB) 1236, which is coupled to an instruction fetch unit 1238, which is coupled to a decode unit 1240. The decode unit 1240 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1240 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1290 includes a microcode ROM or other medium that stores microcode for certain macroinstructions (e.g., in decode unit 1240 or otherwise within the front end unit 1230). The decode unit 1240 is coupled to a rename/allocator unit 1252 in the execution engine unit 1250.

The execution engine unit 1250 includes the rename/allocator unit 1252 coupled to a retirement unit 1254 and a set of one or more scheduler unit(s) 1256. The scheduler unit(s) 1256 represents any number of different schedulers, including reservations stations, central instruction window, etc. The scheduler unit(s) 1256 is coupled to the physical register file(s) unit(s) 1258. Each of the physical register file(s) units 1258 represents one or more physical register files, different ones of which store one or more different data types, such as scalar integer, scalar floating-point, packed integer, packed floating-point, vector integer, vector floating-point, status (e.g., an instruction pointer that is the address of the next instruction to be executed), etc. In one example, the physical register file(s) unit 1258 comprises a vector registers unit, a write mask registers unit, and a scalar registers unit. These register units may provide architectural vector registers, vector mask registers, and general purpose registers. The physical register file(s) unit(s) 1258 is overlapped by the retirement unit 1254 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1254 and the physical register file(s) unit(s) 1258 are coupled to the execution cluster(s) 1260. The execution cluster(s) 1260 includes a set of one or more execution units 1262 and a set of one or more memory access units 1264. The execution units 1262 may perform various operations (e.g., shifts, addition, subtraction, multiplication) and on various types of data (e.g., scalar floating-point, packed integer, packed floating-point, vector integer, vector floating-point). While some embodiments may include a number of execution units dedicated to specific functions or sets of functions, other embodiments may include only one execution unit or multiple execution units that all perform all functions. The scheduler unit(s) 1256, physical register file(s) unit(s) 1258, and execution cluster(s) 1260 are shown as being possibly plural because certain embodiments create separate pipelines for certain types of data/operations (e.g., a scalar integer pipeline, a scalar floating-point/packed integer/packed floating-point/vector integer/vector floating-point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1264). It should also be understood that where separate pipelines are used, one or more of these pipelines may be out-of-order issue/execution and the rest in-order.

The set of memory access units 1264 is coupled to the memory unit 1270, which includes a data TLB unit 1272 coupled to a data cache unit 1274 coupled to a level 2 (L2) cache unit 1276. In one exemplary embodiment, the memory access units 1264 may include a load unit, a store address unit, and a store data unit, each of which is coupled to the data TLB unit 1272 in the memory unit 1270. In one example, the TLB unit 1272 stores the translations of virtual memory addresses to physical memory addresses. The instruction cache unit 1234 is further coupled to a level 2 (L2) cache unit 1276 in the memory unit 1270. The L2 cache unit 1276 is coupled to one or more other levels of cache and eventually to a main memory.

One or more levels of a data cache and/or one or more levels of a tag cache may be implemented with a 3D DRAM integrated with the core 1290. For example, the integrated 3D DRAM 1275 is coupled with the memory unit 1270. The integrated 3D DRAM may include one or more caches, such as an L4 cache 1279 and a memory-side cache 1277, and/or other caches. Some of the caches (e.g., L4, etc.) may be shared by multiple cores, while other caches may be private to a core. In the illustrated example, one or more tag caches 1271 are implemented on the memory unit 1270. The memory unit 1270 includes cache control logic 1269 (e.g., a cache controller, such as the cache controller 115 of FIG. 1E).

By way of example, the exemplary register renaming, out-of-order issue/execution core architecture may implement the pipeline 1200 as follows: 1) the instruction fetch 1238 performs the fetch and length decoding stages 1202 and 1204; 2) the decode unit 1240 performs the decode stage 1206; 3) the rename/allocator unit 1252 performs the allocation stage 1208 and renaming stage 1210; 4) the scheduler unit(s) 1256 performs the schedule stage 1212; 5) the physical register file(s) unit(s) 1258 and the memory unit 1270 perform the register read/memory read stage 1214; the execution cluster 1260 perform the execute stage 1216; 6) the memory unit 1270 and the physical register file(s) unit(s) 1258 perform the write back/memory write stage 1218; 7) various units may be involved in the exception handling stage 1222; and 8) the retirement unit 1254 and the physical register file(s) unit(s) 1258 perform the commit stage 1224.

The core 1290 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 1290 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1234/1274 and a shared L2 cache unit 1276, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 13B:
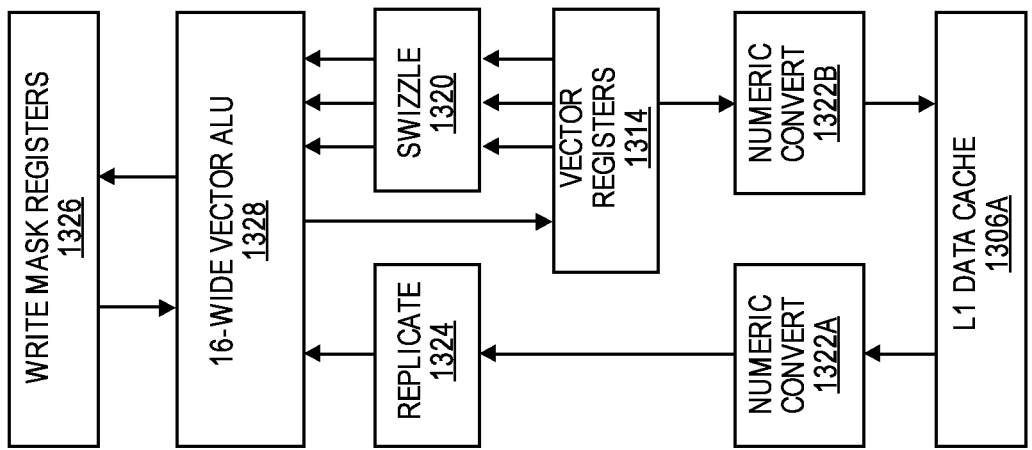
FIG. 13B is an expanded view of an example of part of the processor core in FIG. 13A.
Figure 13A:
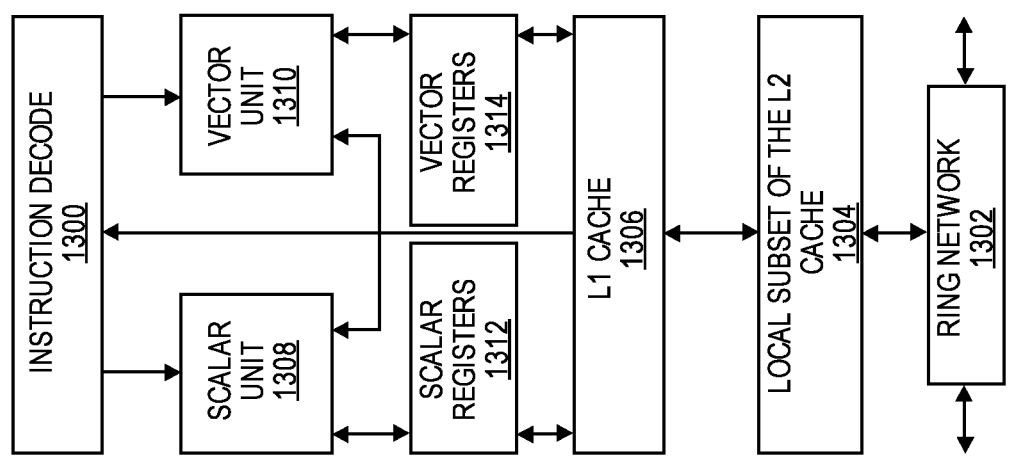
FIG. 13A is a block diagram of an example of a single processor core, along with its connection to the on-die interconnect network and with its local subset of the Level 2 (L2) cache.

FIGS. 13A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 13A is a block diagram of a single processor core, along with its connection to the on-die interconnect network 1302 and with its local subset of the Level 2 (L2) cache 1304, according to some embodiments of the invention. In one example, an instruction decoder 1300 supports the x86 instruction set with a packed data instruction set extension. An L1 cache 1306 allows low-latency accesses to cache memory into the scalar and vector units. While in one example (to simplify the design), a scalar unit 1308 and a vector unit 1310 use separate register sets (respectively, scalar registers 1312 and vector registers 1314) and data transferred between them is written to memory and then read back in from a level 1 (L1) cache 1306, alternative examples may use a different approach (e.g., use a single register set or include a communication path that allow data to be transferred between the two register files without being written and read back).

The local subset of the L2 cache 1304 is part of a global L2 cache that is divided into separate local subsets, one per processor core. Each processor core has a direct access path to its own local subset of the L2 cache 1304. Data read by a processor core is stored in its L2 cache subset 1304 and can be accessed quickly, in parallel with other processor cores accessing their own local L2 cache subsets. Data written by a processor core is stored in its own L2 cache subset 1304 and is flushed from other subsets, if necessary. The ring network ensures coherency for shared data. The ring network is bi-directional to allow agents such as processor cores, L2 caches and other logic blocks to communicate with each other within the chip. In one example, each ring data-path is 1012-bits wide per direction.

FIG. 13B is an expanded view of an example of part of the processor core in FIG. 13A. FIG. 13B includes an L1 data cache 1306A part of the L1 cache 1306, as well as more detail regarding the vector unit 1310 and the vector registers 1314. Specifically, the vector unit 1310 is a 16-wide vector processing unit (VPU) (see the 16-wide ALU 1328), which executes one or more of integer, single-precision float, and double-precision float instructions. The VPU supports swizzling the register inputs with swizzle unit 1320, numeric conversion with numeric convert units 1322A and 1322B, and replication with replication unit 1324 on the memory input. Write mask registers 1326 allow predicating resulting vector writes.

Figure 14:
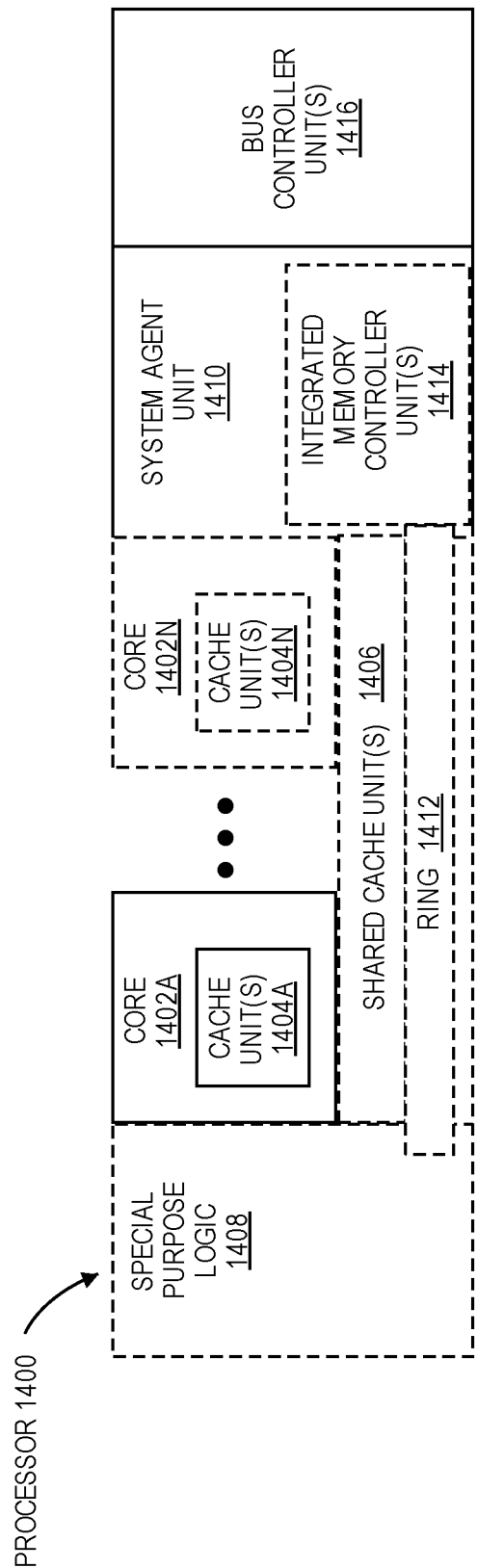
FIG. 14 is a block diagram of an example of a processor that may have more than one core, may have an integrated memory controller, and may have integrated graphics.

FIG. 14 is a block diagram of an example of a processor 1400 that may have more than one core, may have an integrated memory controller, and may have integrated graphics. The solid lined boxes in FIG. 14 illustrate a processor 1400 with a single core 1402A, a system agent 1410, a set of one or more bus controller units 1416, while the optional addition of the dashed lined boxes illustrates an alternative processor 1400 with multiple cores 1402A through 1402N, a set of one or more integrated memory controller unit(s) 1414 in the system agent unit 1410, and special purpose logic 1408.

Thus, different implementations of the processor 1400 may include: 1) a CPU with the special purpose logic 1408 being integrated graphics and/or scientific (throughput) logic (which may include one or more cores), and the cores 1402A-N being one or more general purpose cores (e.g., general purpose in-order cores, general purpose out-of-order cores, a combination of the two); 2) a coprocessor with the cores 1402A-N being a large number of special purpose cores intended primarily for graphics and/or scientific (throughput); and 3) a coprocessor with the cores 1402A-N being a large number of general purpose in-order cores. Thus, the processor 1400 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1400 may be a part of and/or may be implemented on one or more substrates using any of a number of process technologies, such as, for example, BiCMOS, CMOS, or NMOS.

The memory hierarchy includes one or more levels of cache within the cores, a set of one or more shared cache units 1406, and external memory (not shown) coupled to the set of integrated memory controller units 1414. The set of shared cache units 1406 may include one or more mid-level caches, such as level 2 (L2), level 3 (L3), level 4 (L4), or other levels of cache, a last level cache (LLC), and/or combinations thereof. One or more levels of cache maybe implemented in an on-package 3D DRAM. While in one example a ring based interconnect unit 1412 interconnects the integrated graphics logic 1408 (integrated graphics logic 1408 is an example of and is also referred to herein as special purpose logic), the set of shared cache units 1406, and the system agent unit 1410/integrated memory controller unit(s) 1414, alternative examples may use any number of well-known techniques for interconnecting such units. In one example, coherency is maintained between one or more cache units 1406 and cores 1402-A-N.

In some examples, one or more of the cores 1402A-N are capable of multi-threading. The system agent 1410 includes those components coordinating and operating cores 1402A-N. The system agent unit 1410 may include for example a power control unit (PCU) and a display unit. The PCU may be or include logic and components needed for regulating the power state of the cores 1402A-N and the integrated graphics logic 1408. The display unit is for driving one or more externally connected displays.

The cores 1402A-N may be homogenous or heterogeneous in terms of architecture instruction set; that is, two or more of the cores 1402A-N may be capable of execution the same instruction set, while others may be capable of executing only a subset of that instruction set or a different instruction set.

FIGS. 15-18 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 15:
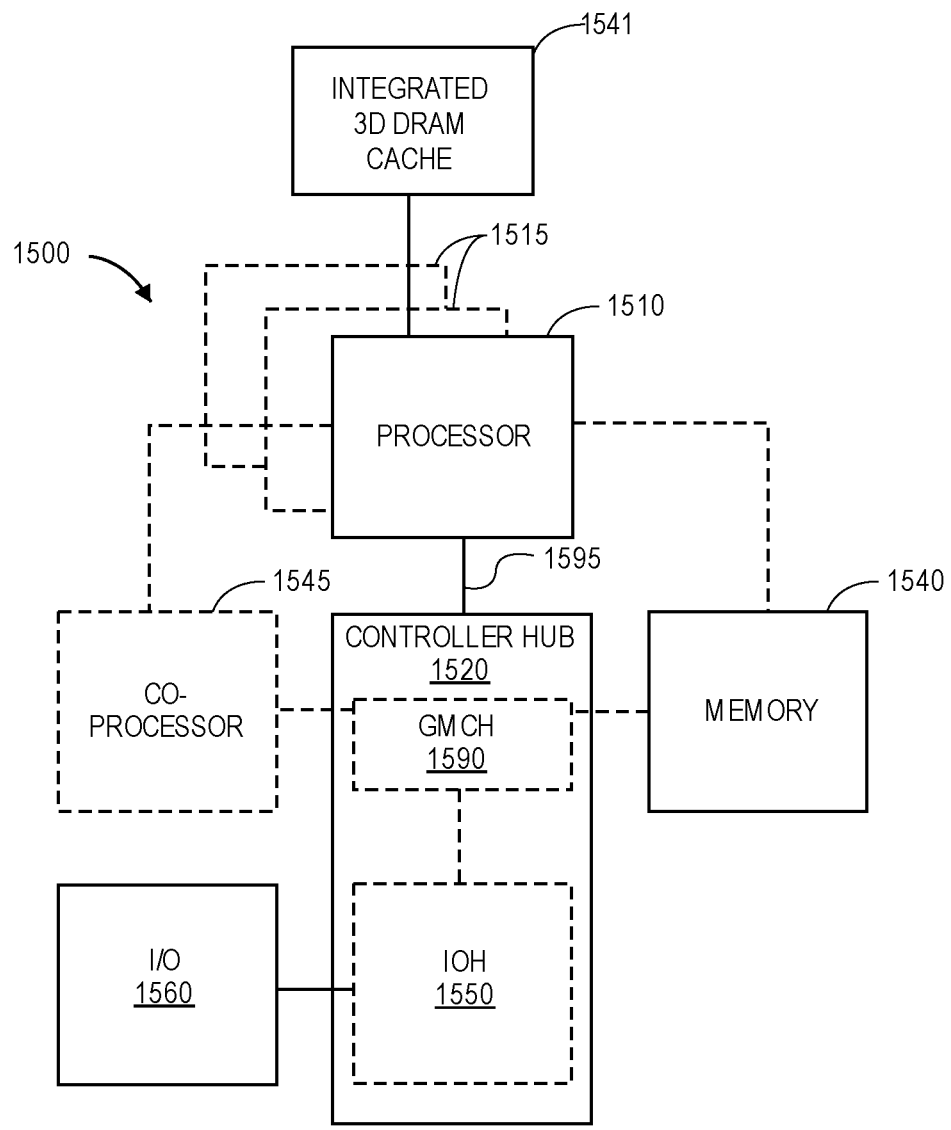
FIGS. 15-18 are block diagrams of exemplary computer architectures.

Referring now to FIG. 15, shown is a block diagram of a system 1500 in accordance with one embodiment of the present invention. The system 1500 may include one or more processors 1510, 1515, which are coupled to a controller hub 1520. In one embodiment the controller hub 1520 includes a graphics memory controller hub (GMCH) 1590 and an Input/Output Hub (IOH) 1550 (which may be on separate chips); the GMCH 1590 includes memory and graphics controllers to which are coupled memory 1540 and a coprocessor 1545; the IOH 1550 couples input/output (I/O) devices 1560 to the GMCH 1590. Alternatively, one or both of the memory and graphics controllers are integrated within the processor (as described herein), the memory 1540 and the coprocessor 1545 are coupled directly to the processor 1510, and the controller hub 1520 in a single chip with the IOH 1550.

The optional nature of additional processors 1515 is denoted in FIG. 15 with broken lines. Each processor 1510, 1515 may include one or more of the processing cores described herein and may be some version of the processor 1400. One or more 3D DRAM caches 1541 are integrated with the processor 1510.

The memory 1540 may be, for example, dynamic random access memory (DRAM), phase change memory (PCM), or a combination of the two. For at least one embodiment, the controller hub 1520 communicates with the processor(s) 1510, 1515 via a multi-drop bus, such as a frontside bus (FSB), point-to-point interface such as QuickPath Interconnect (QPI), or similar connection 1595.

In one embodiment, the coprocessor 1545 is a special-purpose processor, such as, for example, a high-throughput MIC processor, a network or communication processor, compression engine, graphics processor, GPGPU, embedded processor, or the like. In one embodiment, controller hub 1520 may include an integrated graphics accelerator.

There can be a variety of differences between the physical resources 1510, 1515 in terms of a spectrum of metrics of merit including architectural, microarchitectural, thermal, power consumption characteristics, and the like.

In one embodiment, the processor 1510 executes instructions that control data processing operations of a general type. Embedded within the instructions may be coprocessor instructions. The processor 1510 recognizes these coprocessor instructions as being of a type that should be executed by the attached coprocessor 1545. Accordingly, the processor 1510 issues these coprocessor instructions (or control signals representing coprocessor instructions) on a coprocessor bus or other interconnect, to coprocessor 1545. Coprocessor(s) 1545 accept and execute the received coprocessor instructions.

Figure 16:
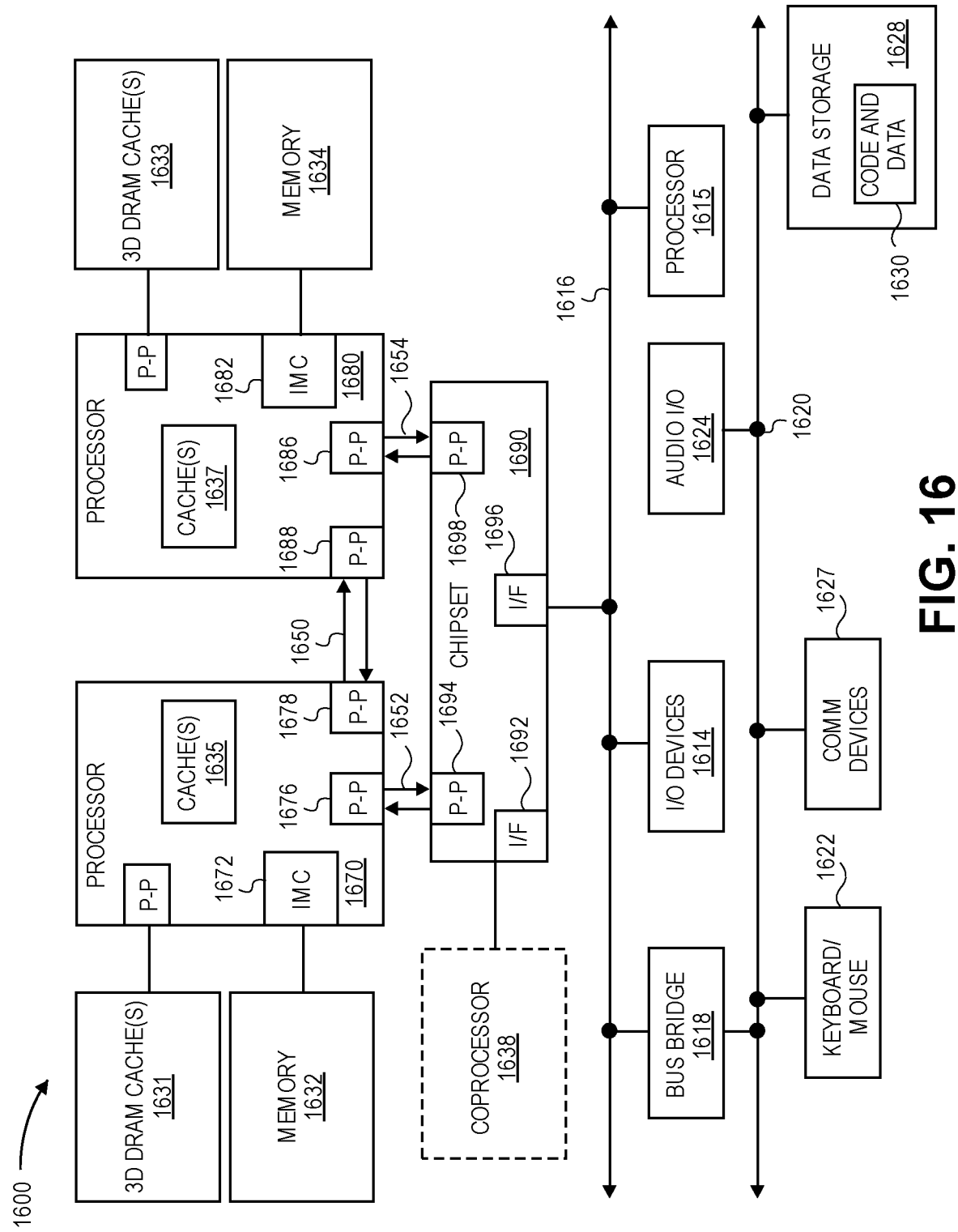

Referring now to FIG. 16, shown is a block diagram of a first more specific exemplary system 1600 in accordance with an embodiment of the present invention. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of the processor 1400. In some embodiments, processors 1670 and 1680 are respectively processors 1510 and 1515, while coprocessor 1638 is coprocessor 1545. In another embodiment, processors 1670 and 1680 are respectively processor 1510 coprocessor 1545.

Processors 1670 and 1680 are shown including integrated memory controller (IMC) units 1672 and 1682, respectively. Processor 1670 also includes as part of its bus controller units point-to-point (P-P) interfaces 1676 and 1678; similarly, second processor 1680 includes P-P interface circuits 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors.

Processors 1670, 1680 may each exchange information with a chipset 1690 via individual P-P interfaces 1652, 1654 using point to point interface circuits 1676, 1694, 1686, 1698. Chipset 1690 may optionally exchange information with the coprocessor 1638 via a high-performance interface 1692. In one embodiment, the coprocessor 1638 is a special-purpose processor, such as, for example, a high-throughput MIC processor, a network or communication processor, compression engine, graphics processor, GPGPU, embedded processor, or the like.

One or more caches 1635, 1637 may be included in either processor and one or more caches 1631, 1633 may be included outside of both processors yet in package with the processors and connected with the processors via P-P interconnect. In one example, in addition to a data cache, the cache 1635 and 1637 include one or more levels of tag cache. The 3D DRAM caches 1631, 1633 may include, for example, L4 cache, memory-side cache, and/or other levels of cache.

Chipset 1690 may be coupled to a first bus 1616 via an interface 1696. In one embodiment, first bus 1616 may be a Peripheral Component Interconnect (PCI) bus, or a bus such as a PCI Express bus or another third generation I/O interconnect bus, although the scope of the present invention is not so limited.

As shown in FIG. 16, various I/O devices 1614 may be coupled to first bus 1616, along with a bus bridge 1618 which couples first bus 1616 to a second bus 1620. In one embodiment, one or more additional processor(s) 1615, such as coprocessors, high-throughput MIC processors, GPGPU's, accelerators (such as, e.g., graphics accelerators or digital signal processing (DSP) units), field programmable gate arrays, or any other processor, are coupled to first bus 1616. In one embodiment, second bus 1620 may be a low pin count (LPC) bus. Various devices may be coupled to a second bus 1620 including, for example, a keyboard and/or mouse 1622, communication devices 1627 and a storage unit 1628 such as a disk drive or other mass storage device which may include instructions/code and data 1630, in one embodiment. Further, an audio I/O 1624 may be coupled to the second bus 1620. Note that other architectures are possible. For example, instead of the point-to-point architecture of FIG. 16, a system may implement a multi-drop bus or other such architecture.

Figure 17:
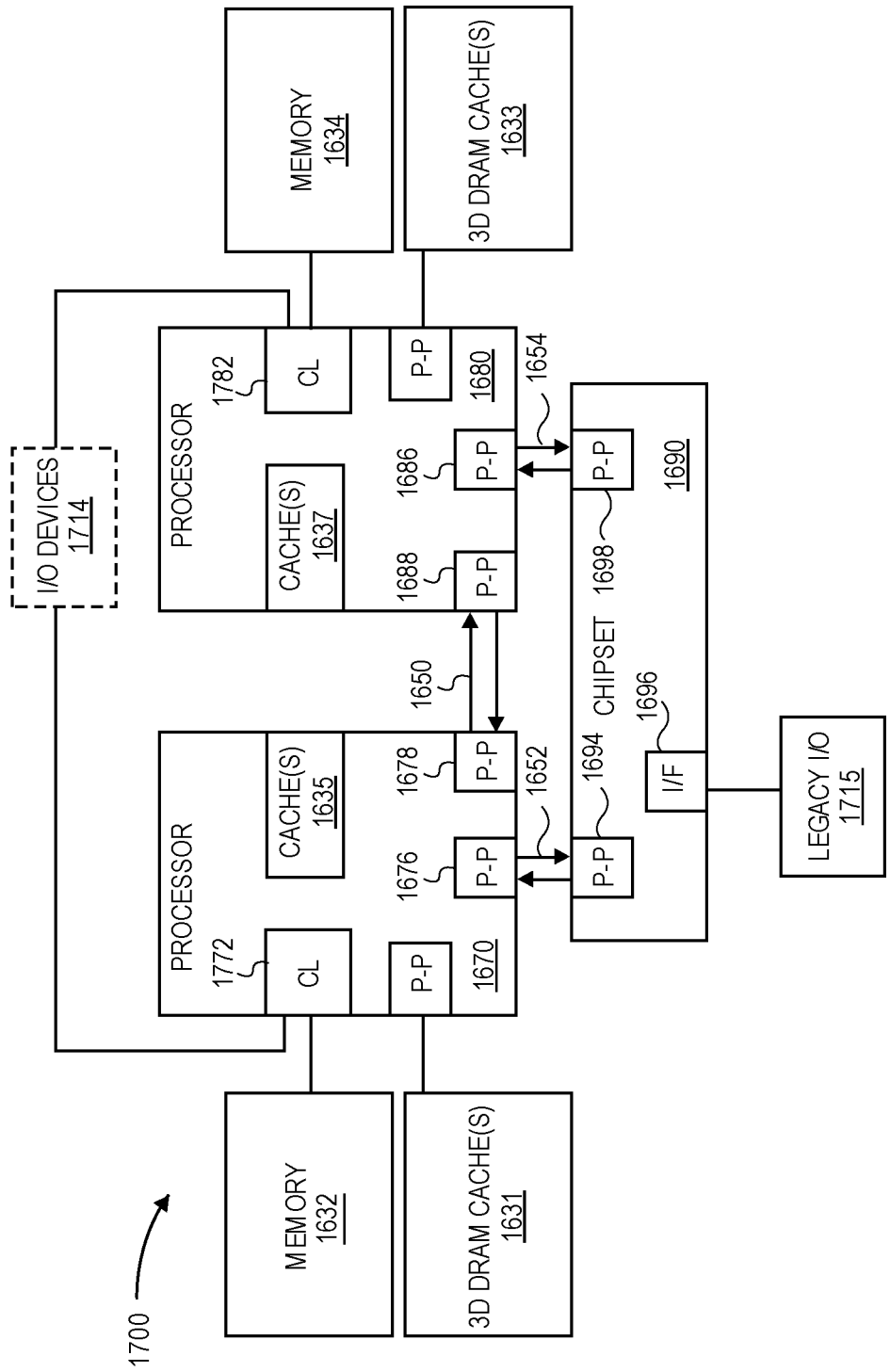

Referring now to FIG. 17, shown is a block diagram of a second more specific exemplary system 1700. Like elements in FIGS. 16 and 17 bear like reference numerals, and certain aspects of FIG. 16 have been omitted from FIG. 17 in order to avoid obscuring other aspects of FIG. 17.

FIG. 17 illustrates that the processors 1670, 1680 may include integrated memory and I/O control logic ("CL") 1772 and 1782, respectively. Thus, the CL 1772, 1782 include integrated memory controller units and include I/O control logic. FIG. 17 illustrates that not only are the memories 1632, 1634 coupled to the CL 1772, 1782, but also that I/O devices 1714 are also coupled to the control logic 1772, 1782. Legacy I/O devices 1715 are coupled to the chipset 1690.

Figure 18:
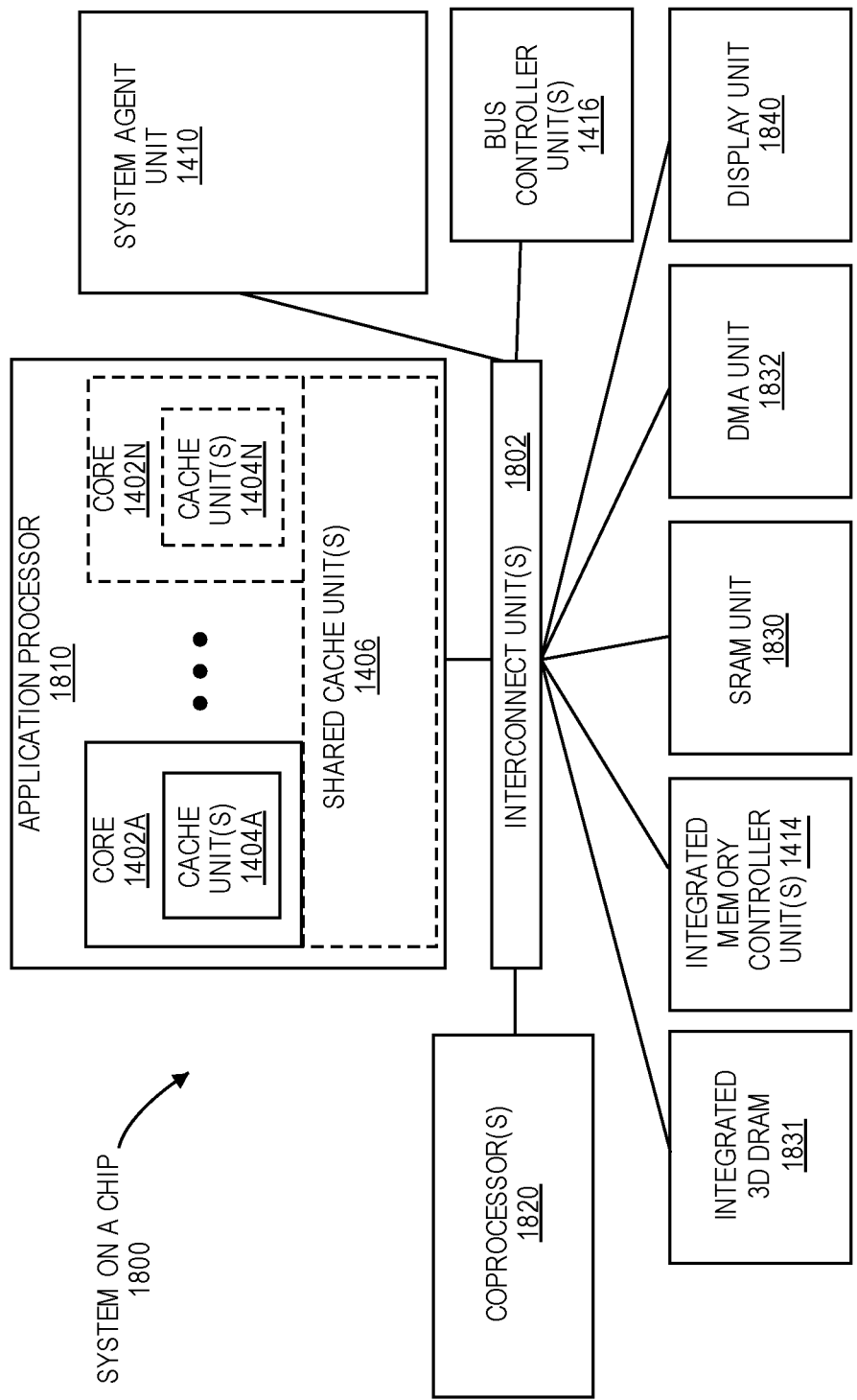

Referring now to FIG. 18, shown is a block diagram of a SoC 1800 in accordance with an embodiment of the present invention. Similar elements in FIG. 14 bear like reference numerals. Also, dashed lined boxes are optional features on more advanced SoCs. In FIG. 18, an interconnect unit(s) 1802 is coupled to: an application processor 1810 which includes a set of one or more cores 1402A-N, which include cache units 1404A through 1404N, and shared cache unit(s) 1406; a system agent unit 1410; a bus controller unit(s) 1416; an integrated memory controller unit(s) 1414; a set of one or more coprocessors 1820 which may include integrated graphics logic, an image processor, an audio processor, and a video processor; an static random access memory (SRAM) unit 1830; a direct memory access (DMA) unit 1832; and a display unit 1840 for coupling to one or more external displays. The interconnect unit 1802 is also connected to 3D DRAM 1831 integrated into the same package as the processor 1810. The integrated 3D DRAM 1831 may be the same as, or similar, the 3D DRAM discussed above (e.g., the 3D DRAM 105 of FIG. 1E). In one example, the coprocessor(s) 1820 include a special-purpose processor, such as, for example, a network or communication processor, compression engine, GPGPU, a high-throughput MIC processor, embedded processor, or the like.

Examples of Integrated 3D DRAM Memory Follow

Example 1: An apparatus including a three-dimensional (3D) DRAM cache including multiple layers of DRAM cells on a die, the multiple layers of DRAM cells connected to one another with vias through the multiple layers, and compute logic stacked with the 3D DRAM cache in a same package. The compute logic includes one or more processor cores, a cache controller, and a tag cache. The cache controller is to: receive a request from a requesting processor core of the one or more processor cores to access data at an address, compare tags in the tag cache with the address, in response to a hit in the tag cache, access data from the 3D DRAM cache at a location indicated by an entry in the tag cache, and send a response to the requesting processor core.

Example 2: The apparatus of example 1, wherein the cache controller is to: in response to a miss in the tag cache, compare tags in the 3D DRAM cache with the address, and in response to a hit in the 3D DRAM cache, store a matching tag in the tag cache and access the data from the 3D DRAM cache.

Example 3: The apparatus of examples 1 or 2, wherein: The 3D DRAM cache includes multiple cache banks, the cache controller includes multiple cache controller banks, and wherein the compute logic further includes circuitry to: determine which of the multiple cache banks is targeted by the address and send the request to one of the multiple cache controller banks corresponding to the cache bank targeted by the address.

Example 4: The apparatus of any of examples 1-3, further including a 3D DRAM memory-side cache to cache data from a local external memory, the compute logic includes a second tag cache, and wherein the cache controller is to: in response to a miss in the 3D DRAM cache, compare tags in the second tag cache with the address, in response to a hit in the second tag cache, access the data from the 3D DRAM memory-side cache at a location indicated by an entry in the second tag cache.

Example 5: The apparatus of any of examples 1-4, wherein the 3D DRAM memory-side cache includes multiple memory-side cache banks, the cache controller includes multiple cache controller banks, and wherein the compute logic further includes circuitry to: determine which of the multiple memory-side cache banks is targeted by the address and send the request to one of the multiple cache controller banks corresponding to the memory-side cache bank targeted by the address.

Example 6: The apparatus of any of examples 1-5, wherein: the compute logic includes an SRAM including the tag cache.

Example 7: The apparatus of any of examples 1-6, wherein: the compute logic includes one or more SRAMs including the tag cache and the second tag cache.

Example 8: The apparatus of any of examples 1-7, wherein: the multiple layers of the 3D DRAM cache include multiple NMOS DRAM layers, each of the multiple NMOS DRAM layers including NMOS select transistors and storage elements, and a PMOS layer including PMOS transistors to form CMOS circuitry in combination with NMOS transistors from one or more of the multiple NMOS DRAM layers.

Example 9: The apparatus of any of examples 1-8, wherein the multiple layers of the 3D DRAM cache include multiple layers of thin film select transistors and storage elements between metal interconnects.

Example 10: The apparatus of any of examples 1-9, wherein the 3D DRAM cache is stacked over the compute logic.

Example 11: The apparatus of any of examples 1-10, wherein the compute logic is stacked over the 3D DRAM cache.

Example 12: A processor stacked with a three-dimensional (3D) DRAM in a package, the processor including one or more processor cores, a tag cache, and cache control circuitry to access the 3D DRAM as a level 4 (L4) cache. The cache control circuitry is to receive a request from a requesting processor core of the one or more processor cores to access data at an address; and compare tags in a tag cache with the address, in response to a hit in the tag cache, access data from the L4 cache at a location indicated by an entry in the tag cache, and send a response to the requesting processor core.

Example 13: The processor of example 12, wherein the cache control circuitry is to: in response to a miss in the tag cache, compare tags in the L4 cache with the address, and in response to a hit in the L4 cache, store a matching tag in the tag cache and access the data from the L4 cache.

Example 14: The processor of any of examples 12-13, wherein the L4 cache includes multiple L4 cache banks, the cache control circuitry includes multiple cache controller banks, and wherein the processor further includes: circuitry to: determine which of the multiple L4 cache banks is targeted by the address and send the request to one of the multiple cache controller banks corresponding to the L4 cache bank targeted by the address.

Example 15: The processor of any of examples 12-14, wherein: the 3D DRAM includes a memory-side cache to cache data from a local external memory, the processor includes a second tag cache, and wherein the cache control circuitry is to: in response to a miss in the L4 cache, compare tags in the second tag cache with the address, in response to a hit in the second tag cache, access the data from the memory-side cache at a location indicated by an entry in the second tag cache.

Example 16: The processor of any of examples 12-15, wherein the memory-side cache includes multiple memory-side cache banks, the cache control circuitry includes multiple cache controller banks, and wherein the processor further includes circuitry to: determine which of the multiple memory-side cache banks is targeted by the address, and send the request to one of the multiple cache controller banks corresponding to the memory-side cache bank targeted by the address.

Example 17: The processor of any of examples 12-16, including an SRAM including the tag cache.

Example 18: The processor of any of examples 12-17, including one or more SRAMs including the tag cache and the second tag cache.

Example 19: A system including a three-dimensional (3D) DRAM including multiple layers of DRAM cells on a die, the multiple layers of DRAM cells connected to one another with vias through the multiple layers, and a processor stacked with the 3D DRAM in a same package. The processor includes one or more processor cores, a cache controller, and a tag cache, wherein the cache controller is to access the 3D DRAM as a last level cache (LLC). The cache controller is to receive a request from a requesting processor core of the one or more processor cores to access data at an address, compare tags in the tag cache with the address, in response to a hit in the tag cache, access data from the LLC cache at a location indicated by an entry in the tag cache, and send a response to the requesting processor core.

Example 20: The system of example 19, further including one or more of an external memory device coupled with the processor, a power supply, and a display.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
    a first die comprising a three-dimensional (3D) DRAM cache, wherein:
        the 3D DRAM cache comprises a first layer and a second layer over the first layer, wherein the second layer is one of multiple layers comprising DRAM cells, wherein the multiple layers comprising the DRAM cells are coupled with one another with vias through the multiple layers,
        one of the first layer and the second layer comprises PMOS transistors, and another of the first layer and the second layer comprises NMOS transistors, and
        the 3D DRAM cache comprises CMOS control circuitry comprising a first transistor of the first layer and a second transistor of the second layer; and
    a second die stacked and bonded with the first die in a package, wherein the second die comprises compute logic comprising one or more processor cores.

2. The apparatus of claim 1, wherein:
    the compute logic includes an SRAM including a tag cache.

3. The apparatus of claim 1, wherein:
    the multiple layers of the 3D DRAM cache comprise thin film select transistors and storage elements between metal interconnect layers of a metal stack of the first die.

4. The apparatus of claim 1, wherein:
    the first die comprising the 3D DRAM cache is stacked over the second die comprising the compute logic, and the second die is over and bonded with a package substrate.

5. The apparatus of claim 1, wherein:
    the second die comprising the compute logic is stacked over the first die comprising the 3D DRAM cache, and the first die is over and bonded with a package substrate.

6. The apparatus of claim 1, wherein:
    the compute logic further comprises a cache controller and a tag cache, wherein the cache controller is to:

receive a request from a requesting processor core of the one or more processor cores to access data at an address, compare tags in the tag cache with the address, in response to a hit in the tag cache, access data from the 3D DRAM cache at a location indicated by an entry in the tag cache, and send a response to the requesting processor core.

7. The apparatus of claim 6, wherein the tags are first tags, the hit is a first hit, the data is first data, the entry is a first entry, the tag cache is a first tag cache, and wherein the apparatus further comprises:

a 3D DRAM memory-side cache to cache the data from a local external memory; and the compute logic includes a second tag cache, wherein the cache controller is to:

in response to a miss in the 3D DRAM cache, compare second tags in the second tag cache with the address, and in response to a second hit in the second tag cache, access the data from the 3D DRAM memory-side cache at the location indicated by a second entry in the second tag cache.

8. The apparatus of claim 7, wherein:

the 3D DRAM memory-side cache includes multiple memory-side cache banks, the cache controller includes multiple cache controller banks, and the compute logic further includes:

circuitry to:

determine which of the multiple memory-side cache banks is targeted by the address, and send the request to one of the multiple cache controller banks corresponding to a memory-side cache bank targeted by the address.

9. The apparatus of claim 7, wherein:

the compute logic includes one or more SRAMs including the first tag cache and the second tag cache.

10. The apparatus of claim 1, wherein:

the second layer is between a first interconnect layer and a second interconnect layer of a metal layer stack of the first die.

11. The apparatus of claim 1, wherein:

the multiple layers comprise an interconnect layer comprising a metal line and an interlayer comprising a via, and one of the DRAM cells comprises an access transistor in the interconnect layer and a capacitor in the interlayer.

12. The apparatus of claim 1, wherein:

the second layer comprises an access transistor for one of the DRAM cells and a transistor of the CMOS control circuitry.

13. The apparatus of claim 1, wherein:

the first die comprises a substrate, and the multiple layers are over a back side of the substrate.

14. The apparatus of claim 13, wherein:

DRAM memory cells are absent from the first layer.

15. A system comprising:

a three-dimensional (3D) DRAM including multiple layers comprising DRAM cells on a first die, the multiple layers comprising the DRAM cells connected to one another with vias through the multiple layers;

CMOS control circuitry on the first die, wherein the CMOS control circuitry comprises a first transistor in a first layer and a second transistor in a second layer, wherein the second layer is one of the multiple layers comprising the DRAM cells, wherein one of the first transistor and the second transistor is a PMOS transistor and another of the first transistor and the second transistor is an NMOS transistor; and a processor on a second die stacked with the first die comprising the 3D DRAM in a same package, the processor including: one or more processor cores, wherein the second die comprises one or more of a cache controller, and a tag cache, wherein the cache controller is to access the 3D DRAM as a cache, the cache controller to:

receive a request from a requesting processor core of the one or more processor cores to access data at an address, compare tags in the tag cache with the address, in response to a hit in the tag cache, access data from the cache at a location indicated by an entry in the tag cache, and send a response to the requesting processor core.

16. The system of claim 15, further comprising one or more of:

an external memory device coupled with the processor, an input/output (I/O) device, and a display.

17. An apparatus comprising:

a first die comprising a first layer and a metal stack over the first layer, wherein:

the first layer comprises first transistors of a first type and the metal stack comprises multiple layers comprising second transistors of a second type, one of the first type and the second type is NMOS and another of the first type and the second type is PMOS, some of the second transistors of the multiple layers comprise access transistors of DRAM memory cells and one or more other ones of the second transistors form CMOS circuitry with the first transistors of the first layer, and the first die comprises a DRAM cache comprising the DRAM memory cells in the multiple layers; and a second die comprising a processor core, wherein the first die and the second die are stacked over and bonded with one another.

18. The apparatus of claim 17, wherein:

the second die further comprises a cache controller coupled with the DRAM cache and a tag cache coupled with the cache controller.

19. The apparatus of claim 17, wherein:

the DRAM memory cells of the first die are limited to the metal stack.

20. The apparatus of claim 17, wherein:

the metal stack comprises an interconnect layer comprising a metal line and an interlayer comprising a via, and one of the DRAM memory cells comprises an access transistor in the interconnect layer and a capacitor in the interlayer.

* * * * *